(12) United States Patent
Shiota et al.

(10) Patent No.: US 9,607,861 B2
(45) Date of Patent: Mar. 28, 2017

(54) SEMICONDUCTOR DEVICE AND METHOD OF MANUFACTURING THE SAME

(71) Applicant: TERA PROBE, INC., Yokohama, Kanagawa (JP)

(72) Inventors: Junji Shiota, Hamura (JP); Ichiro Kono, Higashiyamato (JP)

(73) Assignee: AOI ELECTRONICS CO., LTD., Kagawa (JP)

( * ) Notice: Subject to any disclaimer, the term of this patent is extended or adjusted under 35 U.S.C. 154(b) by 0 days.

(21) Appl. No.: 15/016,070

(22) Filed: Feb. 4, 2016

(65) Prior Publication Data

US 2016/0233111 A1 Aug. 11, 2016

(30) Foreign Application Priority Data

Feb. 6, 2015 (JP) ................. 2015-022191

(51) Int. Cl.
| | | |
|---|---|---|
| H01L 21/44 | (2006.01) | |
| H01L 21/56 | (2006.01) | |
| H01L 21/683 | (2006.01) | |
| H01L 21/304 | (2006.01) | |
| H01L 21/306 | (2006.01) | |
| H01L 21/78 | (2006.01) | |

(Continued)

(52) U.S. Cl.
CPC ............ *H01L 21/56* (2013.01); *H01L 21/304* (2013.01); *H01L 21/3081* (2013.01); *H01L 21/30625* (2013.01); *H01L 21/6835* (2013.01); *H01L 21/6836* (2013.01); *H01L 21/768* (2013.01); *H01L 21/78* (2013.01); *H01L 23/3114* (2013.01); *H01L 23/562* (2013.01); *H01L 24/11* (2013.01); *H01L 24/12* (2013.01); *H01L 23/525* (2013.01); *H01L 29/0657* (2013.01); *H01L 2221/6834* (2013.01); *H01L 2221/68327* (2013.01); *H01L 2221/68381* (2013.01); *H01L 2224/94* (2013.01)

(58) Field of Classification Search
CPC ... H01L 21/56; H01L 21/6836; H01L 21/768; H01L 21/3081; H01L 21/304; H01L 21/30625; H01L 21/78; H01L 24/11; H01L 24/12; H01L 23/3114; H01L 23/525; H01L 23/562
See application file for complete search history.

(56) References Cited

U.S. PATENT DOCUMENTS

| 2006/0281315 | A1* | 12/2006 | Burke ................. H01L 21/6835 438/689 |
| 2010/0144096 | A1 | 6/2010 | Koroku et al. |
| 2010/0144097 | A1 | 6/2010 | Koroku et al. |

FOREIGN PATENT DOCUMENTS

| JP | 4725638 B2 | 7/2011 |
| JP | 4725639 B2 | 7/2011 |
| JP | 2011176069 A | 9/2011 |

* cited by examiner

*Primary Examiner* — (Vikki) Hoa B Trinh
(74) *Attorney, Agent, or Firm* — Holtz, Holtz & Volek PC

(57) ABSTRACT

A method of manufacturing a semiconductor device, including steps of: (a) bonding a support plate to a first main face of a wafer, the first main face having an integrated circuit disposed thereon; (b) thinning the wafer by polishing or grinding a second main face after step (a), the second main face being opposite to the first main face; (c) dividing the wafer into multiple chip bodies concurrently with or after step (b); (d) bonding multiple reinforcing layers to second main faces of the respective chip bodies after step (c); and (e) removing the support plate after step (d).

10 Claims, 24 Drawing Sheets

(51) Int. Cl.
  *H01L 21/308*    (2006.01)
  *H01L 21/768*    (2006.01)
  *H01L 23/00*     (2006.01)
  *H01L 23/31*     (2006.01)
  H01L 29/06       (2006.01)
  H01L 23/525      (2006.01)

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device.

2. Description of Related Art

A typical method of packaging semiconductor chips is wafer-level packaging (WLP). The WLP method involves applying a liquid resin to a semiconductor wafer, curing the liquid resin into a sealing layer, and dividing the semiconductor wafer together with the sealing layer into small pieces (See Japanese Unexamined Patent Application Publication No. 2011-176069, Japanese Patent No. 4725638, and Japanese Patent No. 4725639). This method enables the production of small packages with substantially the same size as that of semiconductor chips.

A thermosetting liquid resin shrinks when it is cured. This causes warpage of a semiconductor wafer and semiconductor chips produced by division of the semiconductor wafer into small pieces. In particular, as the thickness of the semiconductor wafer decreases, its warpage increases.

The recent advance on reduced dimensions of mobile devices (end products) leads to an increasing demand for thinner semiconductor components to be implemented on such devices.

Further thinning of semiconductor chips according to the WLP method involving the use of a wafer should clear the following challenges:

(A1) Transfer of a thinned wafer having a reduced strength without damage.

(A2) Prevention of the warpage of a wafer: As the thickness of the Si layer decreases, the warpage of the wafer increases during processing to the extent that it can be no longer processed. For example, a robot hand cannot suck a wafer for transfer; a wafer cannot be sucked on a stage for processing or accommodated in a cassette slot; or a notch aligner centering the wafer to detect the orientation of the wafer cannot be focused on the wafer, leading to abnormal operation.

(A3) Prevention of the warpage of the structure of a chip (maintenance of uniformity or coplanarity): Individual chips from a warped wafer also warp and cause problems when implemented on devices or adversely affect their reliability.

(A4) For wafers which are vulnerable to large warpage and adversely affect reliability due to their fragile structure in the device, such as (1) those having a low-k multilayer wiring structure and (2) those having memory cells, preventing warpage is crucial to improve a yield rate and reliability.

As mentioned above, the warpage of a wafer is generally caused by shrinkage of a thermosetting resin. As the semiconductor substrate becomes thinner, the warpage increases and, in particular, more increases in the following cases:

(B1) Large chips from a wafer having a thin semiconductor substrate (B2) The wafer has structures, such as rewiring layers, electrodes for external connections (bumps, posts, or pillars), or UBM layers functioning as electrodes for external connections. It is known from the experience that any combination of these structures with a thermosetting resin further aggravates the warpage. A direct contact of a resin film with rewiring layers, UBM layers, or bump electrodes generates a high stress, which causes warpage.

(B3) A rewiring layer on a semiconductor substrate has a large area for routing common signal wires for power supply and grounding.

SUMMARY OF THE INVENTION

An object of the present invention, which has been made to overcome the disadvantages described above, is to minimize the warpage of a wafer and semiconductor devices manufactured by division of the wafer into small pieces.

In order to achieve the above object, according to a first aspect of the present invention, there is provided a method of manufacturing a semiconductor device, including steps of: (a) bonding a support plate to a first main face of a wafer, the first main face having an integrated circuit disposed thereon; (b) thinning the wafer by polishing or grinding a second main face after step (a), the second main face being opposite to the first main face; (c) dividing the wafer into multiple chip bodies concurrently with or after step (b); (d) bonding multiple reinforcing layers to second main faces of the respective chip bodies after step (c); and (e) removing the support plate after step (d).

According to a second aspect of the present invention, there is provided a method of manufacturing a semiconductor device, including steps of: (a) bonding a support plate to a first main face of a wafer, the first main face having an integrated circuit disposed thereon; (b) thinning the wafer by polishing or grinding a second main face after step (a), the second main face being opposite to the first main face; (c) bonding multiple reinforcing layers to the second main face of the wafer so as to be arrayed along the second main face of the wafer after step (b); (d) dividing the wafer into multiple chip bodies after step (c) so that the chip bodies correspond to the respective reinforcing layers; and (e) removing the support plate after step (d).

According to a third aspect of the present invention, there is provided a method of manufacturing a semiconductor device, including steps of: (a) bonding a support plate to a first main face of a wafer, the first main face having an integrated circuit disposed thereon; (b) thinning the wafer by polishing or grinding a second main face after step (a), the second main face being opposite to the first main face; (c) bonding a reinforcing plate to the second main face after step (b); (d) dividing the reinforcing plate to multiple reinforcing layers and dividing the wafer into multiple chip bodies so that the chip bodies correspond to the respective reinforcing layers after step (c); and (e) removing the support plate after step (d).

According to a fourth aspect of the present invention, there is provided a method of manufacturing a semiconductor device, including steps of: (a) bonding a support plate to a first main face of a wafer, the first main face having an integrated circuit and a thermosetting resin layer covering the integrated circuit which are disposed on the first main face;

(b) thinning the wafer by polishing or grinding a second main face after step (a), the second main face being opposite to the first main face; (c) applying a thermosetting resin to the second main face of the wafer and curing the thermosetting resin after step (b) to form a cured shrinkage layer having a higher internal stress than an internal stress of the thermosetting resin layer; (d) dividing the wafer into multiple chip bodies after step (c); and (e) removing the support plate after step (d).

According to a fifth aspect of the present invention, there is provided a semiconductor device, including: a chip body which is provided with an integrated circuit on a first main face; and a reinforcing layer which is bonded to a second main face of the chip body, the second main face being opposite to the first main face.

According to a sixth aspect of the present invention, there is provided a semiconductor device, including: a chip body which is provided with an integrated circuit and a thermosetting resin layer covering the integrated circuit, the integrated circuit and the thermosetting resin layer being disposed on a first main face of the chip body; and a cured shrinkage layer which is disposed on a second main face opposite to the first main face of the chip body, and has a higher internal stress than an internal stress of the thermosetting resin layer.

According to the first, second, third and fifth aspects of the present invention, a chip body is reinforced by a reinforcing layer, thus preventing the flexure of the chip body.

According to the fourth and sixth aspects of the present invention, the flexure of a chip body caused by a thermosetting resin layer disposed on the first main face of the chip body and the flexure of the chip body caused by a cured shrinkage layer are offset to substantially prevent the flexure of the chip body since the direction of the former flexure is reverse to the direction of the latter flexure.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENT

The embodiments of the present invention will now be described with reference to the drawings. The embodiments described below include technically preferred restrictions for implementing the present invention. The following embodiments and exemplary drawings should not be construed to limit the scope of the present invention.

First Embodiment

Figure 1:
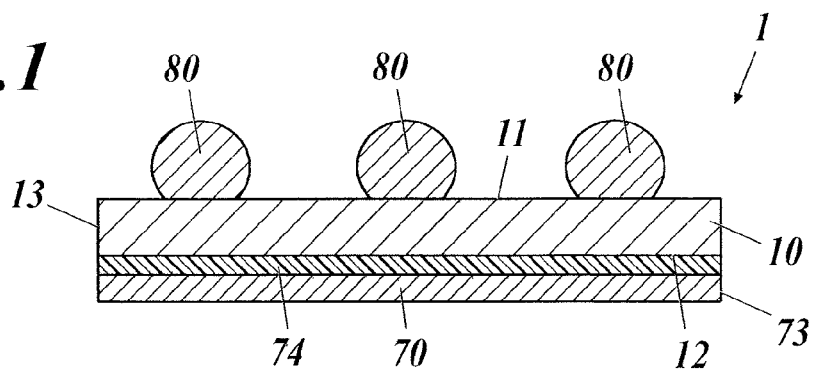
FIG. 1 is a schematic cross-sectional view of a semiconductor device.

FIG. 1 is a schematic cross-sectional view of a semiconductor device 1.

The semiconductor device 1 is a separated semiconductor chip. The semiconductor device 1 includes a chip body 10, a reinforcing layer 70, a bonding layer 74, and solder bumps 80. The solder bumps 80 may be omitted or may be replaced with bumps composed of a material other than solder, such as electrodes for external connections.

The chip body 10 is manufactured by division of a wafer into pieces. The top and bottom faces of the chip body 10 have an area of, for example, 40 mm$^2$ or more.

The chip body 10 includes a first main face 11 on its front side and a second main face 12 on its rear side. Although specific examples of the chip body 10 will be given later, the chip body 10 is one of a chip scale package (CSP) with rewiring layers and pillar terminals (see FIG. 9), a CSP with rewiring layers and UBM layers (see FIG. 10), and a CSP with terminals (see FIG. 11). A process for manufacturing a semiconductor device involves a front-end process and a back-end process. In the front-end process, an integrated circuit is fabricated on the wafer and in the back-end process, the wafer is divided into chips and the chips are packaged, as needed, for shipping. The "rewiring" refers to the action of wiring or the wired lines in the back-end process. The "pillar terminals" refer to pillar-shaped terminals manufactured in the back-end process. UBM layers refer to under-bump-metallization layers.

Figure 2:
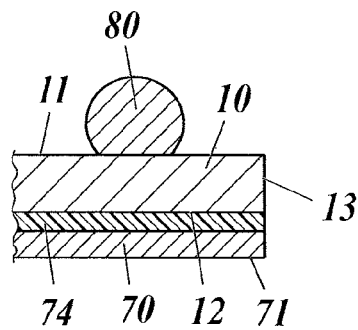
FIG. 2 is a schematic cross-sectional view of a peripheral edge of a semiconductor device.
Figure 3:
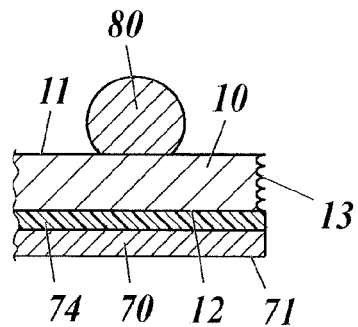
FIG. 3 is a schematic cross-sectional view of a peripheral edge of a semiconductor device.
Figure 4:
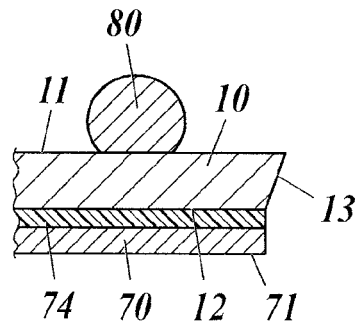
FIG. 4 is a schematic cross-sectional view of a peripheral edge of a semiconductor device.

The chip body 10 includes an outer periphery 13, which may be entirely or partially flat (see FIG. 2) or scalloped (see FIG. 3). The outer periphery 13 of the chip body 1C) may be perpendicular to (see FIG. 2) or inclined (see FIG. 4) with respect to the first main face 11 of the chip body 10. With reference to FIG. 2, the outer periphery 13 of the chip body 10 is a flat due to blade or laser dicing. With reference to FIG. 3, the outer periphery 13 of the chip body 10 is scalloped due to a Bosch process for deep etching. With reference to FIG. 4, the outer periphery of the chip body 10 is inclined due to reactive ion etching (RIE).

The first main face 11 of the chip body 10 is provided with multiple terminals. These terminals are provided with the respective solder bumps 80 thereon. The solder bumps 80 are either of an overhang type (see FIG. 1) or a hemisphere type (see FIG. 5). The overhang type refers to a solder bump 80 having a maximum diameter not located at its bottom. More specifically, such a solder bump is larger than a hemisphere. The hemisphere type refers to a solder bump 80 having a maximum diameter at its bottom. More specifically, such a solder bump is smaller than a hemisphere. For the solder bump 80 of an overhang type, the first main face 11 of the chip body 10 is either exposed (see FIG. 1) or covered with an overcoat layer 14 composed of a resin (see FIG. 6). The overcoat layer 14 is disposed on the first main face 11 of the chip body 10 and covers the lower parts of the solder bumps 80. The part, protruding from the overcoat layer 14, of each solder bump 80 is of a hemisphere type.

A variation in the height of the top surfaces of the solder bumps 80 are 50 μm or less, preferably 20 μm or less, to maintain uniformity or coplanarity.

The second main face 12 of the chip body 10 is polished or ground. More specifically, the second main face 12 is finished by polishing or grinding a semiconductor, in particular, an intrinsic semiconductor. Alternatively, the second main face 12 may be mirror-finished by dry polishing.

The second main face 12 of the chip body 10 has a reinforcing layer 70 bonded thereto via a bonding layer 74. The reinforcing layer 70 reinforces the chip body 10 to prevent the warpage of the chip body 10 by allowing the first main face 11 to be warped into a concave shape and the second main face 12 to be warped into a convex shape.

The reinforcing layer 70 is composed of a metal, such as Fe, Ni, or Cu, or an alloy thereof. Alternatively, the reinforcing layer 70 may be a ceramic. In particular, AlN or SiC is preferred (the reinforcing layer 70, composed of AlN or SiC, has an elastic modulus (for example, longitudinal elastic modulus) equivalent to or higher than that of the metal Fe and a thermal conductivity and a linear expansion coefficient approximate to those of silicon, which is the material of the second main face 12 of the chip body 10). Alternatively, the reinforcing layer 70 may be composed of a fiber reinforced resin, in particular, a carbon fiber reinforced resin, an aramid fiber reinforced resin (for example, Kevlar (a registered trade mark) is used as an aramid fiber), a polyethylene fiber reinforced resin (for example, an ultra-high molecular weight polyethylene fiber (for example, Dyneema (a registered trade mark) is used as a polyethylene fiber). Alternatively, the reinforcing layer 70 may be composed of a resin, in particular, a resin having a high elastic modulus. If a thinner chip body 10 is more likely to be affected by light travelling through the second main face 12, the reinforcing layer 70 is preferably composed of a light-blocking material to reduce the impact of the transmitted light.

The reinforcing layer 70 should preferably have high rigidity and thus have a high elastic modulus (longitudinal elastic modulus, transverse elasticity modulus, bulk modulus of elasticity, or flexure elastic modulus). In particular, the elastic modulus of the reinforcing layer 70 is higher than that of the material (for example, semiconductor silicon) of the second main face 12 of the chip body 10. The reinforcing layer 70 with a high elastic modulus produces an external force (mainly, a bending moment on the chip body 10) less likely to cause warpage of the reinforcing layer 70. This enables thinning of the reinforcing layer 70.

However, if the rigidity of the reinforcing layer 70 is lower than that of the semiconductor substrate (the chip body 10) having a thickness corresponding to the total thickness of the reinforcing layer 70 and the bonding layer 74, reinforcement and thinning cannot be achieved at the same time. Let the thickness of the reinforcing layer 70 be t1, the thickness of the bonding layer 74 be t2, and t1+t2=T. If the rigidity of a semiconductor substrate with a thickness of T is higher than that of the reinforcing layer 70 with a thickness of t1, reinforcement and thinning cannot be achieved at the same time. It should be noted since the bonding layer 74 does not substantially contribute to the enhancement of the rigidity, it can be ignored.

The configuration that meets the following condition is used: (the rigidity of the semiconductor substrate with a thickness of T)<(the rigidity of the reinforcing layer 70 with a thickness of t1).

As the bending rigidity of a board is proportional to its elastic modulus and the cube of its thickness, the above in equation can be expressed as follows: (the elastic modulus of a semiconductor substrate)×$T^3$<(the elastic modulus of the reinforcing layer 70)×$(t1)^3$.

The reinforcing layer 70 should be preferably thicker than the device substrate as it facilitates the thinning of the entire semiconductor device 1.

Besides preventing warpage, the reinforcing layer has several advantageous effects, for example, reduced damage, i.e., cracking and chipping of the device substrate 31 and enhanced heat dissipation. If these effects are important, the reinforcing layer 70 should have an elastic modulus not higher than that of the material of the second main face 12.

The bonding layer 74 is attached to the second main face 12 of the chip body 10 and to the reinforcing layer 70 and may be composed of, for example, a die attaching material or film. The bonding layer 74 may be composed of an electrically conductive or insulating material.

Figure 7:
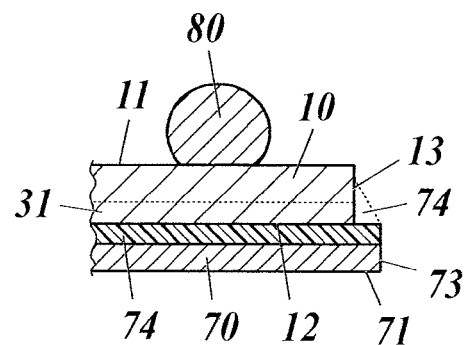
FIG. 7 is a schematic cross-sectional view of a peripheral edge of a semiconductor device.

The bonding layer 74 and the reinforcing layer 70 have an outer periphery 73, which may be flush with (see FIG. 2) or not flush with (see FIG. 7) the outer periphery 13 of the chip body 10. The outer diameter of the bonding layer 74 and the reinforcing layer 70 may be larger than that of the chip body 10. More specifically, the horizontal edge of the reinforcing layer 70 is slightly longer than the corresponding edge of the chip body 10 by approximately 10 μm to 50 μm. In this case, the reinforcing layer 70 may be cut into separated pieces to bond them to the individual chip bodies 10. This method compensates for an alignment error between the reinforcing layer 70 and the chip body 10 to facilitate the covering of the second main face 12 of the chip body 10 with the reinforcing layer. With reference to FIG. 7, this method results in protrusion of the outer periphery 73 of the bonding layer 74 and the reinforcing layer 70 from the outer periphery of the chip body 10. The reinforcing layer 70, which is larger than the chip body 10, reduces damage to the chip body 10 and enhances its reliability.

Figure 8:
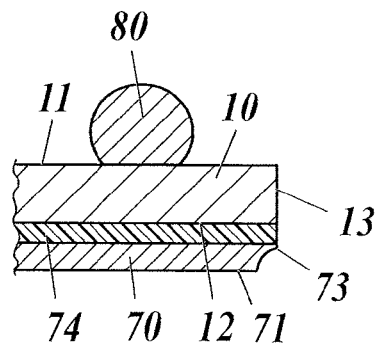
FIG. 8 is a schematic cross-sectional view of a peripheral edge of a semiconductor device.

Regardless the alignment of the outer periphery 73 of the bonding layer 74 and the reinforcing layer 70 with the outer periphery 13 of the chip body 10, the corner defined between a surface 71 of the reinforcing layer 70 and the outer periphery 73 may be a right angle (see FIG. 2 or FIG. 7) or may be coved (FIG. 8). The right-angle corner between the surface 71 of the reinforcing layer 70 and the outer periphery 73, as shown in FIG. 2 or 7, indicates that the reinforcing plate was mechanically cut into multiple reinforcing layers 70 with a blade. The coved corner between the surface 71 of the reinforcing layer 70 and the outer periphery 73, as shown in FIG. 8, indicates that the reinforcing plate was chemically cut into multiple reinforcing layers 70, for example, by etching.

If the reinforcing layer 70 is composed of a material directly bondable to the second main face 12 of the chip body 10 (for example, if the reinforcing layer 70 is fabricated by curing a fiber reinforced resin of prepreg), the bonding layer 74 is omittable and the reinforcing layer 70 may be directly bonded to the second main face 12 of the chip body 10.

Specific examples of the chip body 10 will now be described.

Figure 9:
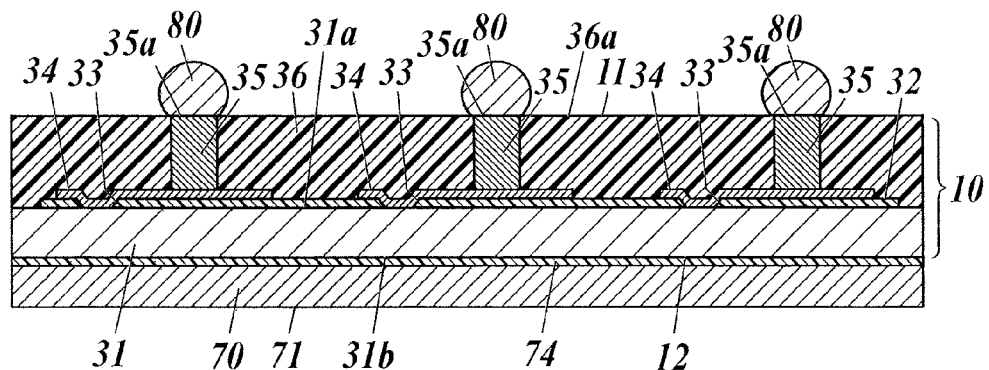
FIG. 9 is a cross-sectional view of a semiconductor device.

FIG. 9 is a cross-sectional view of the semiconductor device 1 in the case where the chip body 10 is a CSP with rewiring layers and pillar terminals.

With reference to FIG. 9, the chip body 10 includes a device substrate 31, an insulating film 32, multiple rewiring layers 34, multiple pillar terminals 35, and a protective (sealing) layer 36.

The device substrate 31 is provided with integrated circuits (for example, ROM, RAM, non-volatile memory, or logics) on the semiconductor substrate (for example, an intrinsic silicon substrate). In other words, integrated circuits are formed on the surface of the semiconductor substrate and covered with a passivation film (for example, an oxide silicon film or silicon nitride film). The surface of the passivation film corresponds to the surface 31a of the device substrate 31 and the opposite surface 31b (the rear of the semiconductor substrate) corresponds to the second main face 12 of the chip body 10. A low-k multilayer wiring structure, a structure formed by alternately stacking low-permittivity films and wiring patterns on the integrated circuit, may be formed and the passivation film may be formed on the low-k multilayer wiring structure. The elastic modulus of the semiconductor substrate is lower than that of the reinforcing layer 70.

If the device substrate 31 of a large chip of 40 mm² or more in area is thinned, for example, to less than 100 μm or even to less than 50 μm, the present invention enables the fabrication of a reliable CSP.

The insulating film 32 is formed on the surface 31a of the device substrate 31. The insulating film 32 is slightly smaller than the device substrate 31 so that the ends of the insulating film 32 do not reach the ends of the device substrate 31. Alternatively, the insulating film 32 may have the same size as that of the device substrate 31, so that the ends of the insulating film 32 are aligned with the ends of the device substrate 31.

The insulating film 32 is composed of an epoxy resin, a polyimide resin, or any other resin. Specifically, the insulating film 32 is formed by curing a photosensitive resin. The insulating film 32 shrinks when it is cured. Alternatively, the insulating film 32 may be composed of any resin other than the photosensitive resin or may be omitted.

The insulating film 32 has openings 33. These openings 33 overlap with pads disposed on the surface 31a of the device substrate 31. If the insulating film 32 is formed by curing a photosensitive resin, the insulating film 32 and the openings 33 are formed through exposure and development processes. The passivation film (the surface 31a of the device substrate 31) also has openings formed therein, which overlap with the openings 33 and the pads.

The rewiring layers 34 are disposed on the insulating film 32 such that they are in a direct contact with the insulating film 32. The rewiring layers 34 are provided so as to cross the openings 33 in the insulating film 32 and connected to the pads through the insulating film openings 33 and the passivation film openings. Each rewiring layer 34 is a laminate that includes a base metal layer (seed layer) and a conductor layer (plated layer) grown thereon. The base metal layer is a thin copper (Cu) film, a thin titanium (Ti) film, a laminate of thin titanium and copper films, or any other thin metal film. The conductor layer is plated with copper or other metal.

The rewiring layer 34 is patterned. In the top view, the base metal layer and the conductor layer of the rewiring layer 34 are each formed into substantially the same predetermined shape. The conductor layer is thicker than the underlying base metal layer. The rewiring layer 34 may be a single conductive layer or a laminate of conductor layers.

Each pillar terminal 35 is connected to the corresponding rewiring layer 34. More specifically, the rewiring layer 34 has one end that serves as a land on which the pillar terminal 35 is disposed. The pillar terminal 35 is thicker (taller) than the rewiring layer 34. The pillar terminal 35 is grown, for example, by electroplating.

The protective (sealing) layer 36 is formed so as to cover the insulating film 32 and the rewiring layers 34, except for the surfaces, having the overlaying pillar terminals 35, of the rewiring layers 34. The protective layer 36 is directly connected to the rewiring layers 34. The pillar terminals 35 are embedded in the protective layer 36 so as to penetrate therethrough. The top surfaces 35a of the pillar terminals 35 are not covered with the protective layer 36. The protective layer 36 is in a close contact with the outer peripheries of the pillar terminals 35 to protect them.

The protective layer 36 is composed of an epoxy resin, a polyimide resin or any other insulating resin, more preferably, an insulating resin (an epoxy or polyimide resin) reinforced with fillers (for example, silica or glass fillers) or fibers (for example, glass or carbon fibers). The protective layer 36 shrinks when its constituent resin is cured.

The surface 36a of the protective layer 36 and the top surfaces 35a of the pillar terminals 35 together correspond to the first main face 11 of the chip body 10.

The top surfaces 35a of the pillar terminals 35 are flush with or slightly lower than the surface 36a of the protective layer 36.

The solder bumps 80 are disposed on the top surfaces 35a of the pillar terminals 35, adjacent to the surface 36a of the protective layer 36. The solder bumps 80 are physically connected to the top surfaces 35a of the pillar terminals 35 to electrically connect the solder bumps 80 to the pillar terminals 35.

Figure 5:
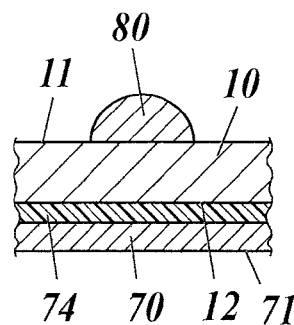
FIG. 5 is a schematic partial cross-sectional view of a semiconductor device.
Figure 6:
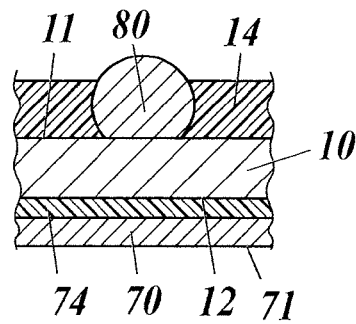
FIG. 6 is a schematic partial cross-sectional view of a semiconductor device.

As mentioned above, the solder bumps 80 are of an overhang type (see FIGS. 1 and 6) or a hemisphere type (see FIG. 5). For the solder bumps 80 of an overhang type, the overcoat layer 14 is preferably disposed on the surface 36a of the protective layer 36. The protective layer 36 and the overcoat layer 14 may be integrated.

The shrinkage of the insulating film 32 and the protective layer 36 generates a bending moment in the chip body 10 to concave the first main face 11. As the linear expansion coefficient of the insulating film 32 increases, the bending moment applied to the chip body 10 increases. As the linear expansion coefficient of the protective layer 36 increases, the bending moment applied to the chip body 10 increases. For the insulating film 32 composed of a thermosetting resin, as the curing temperature of the insulating film 32 increases, the bending moment applied to the chip body 10 increases. For the protective layer 36 composed of a thermosetting resin, as the curing temperature of the protective layer 36 increases, the bending moment applied to the chip body 10 increases. As the storage modulus of the insulating film 32 increases, the bending moment applied to the chip body 10 increases. As the storage modulus of the protective layer 36 increases, the bending moment applied to the chip body 10 increases.

A direct contact of rewiring layers, UBM layers or bump electrodes with a resin film (the insulating film 32 or the protective layer 36) generates a large bending moment and causes warpage.

In addition, the integrated circuit(s) and the passivation film disposed on the surface 31a of the device substrate 31 also contributes to a large bending moment in the chip body 10.

In particular, the significantly thin device substrate 31 is vulnerable to warpage.

Nevertheless, the reinforcing layer 70, disposed on the second main face 12 of the chip body 10, can successfully prevent the warpage of the chip body 10 against such bending moments.

Figure 10:
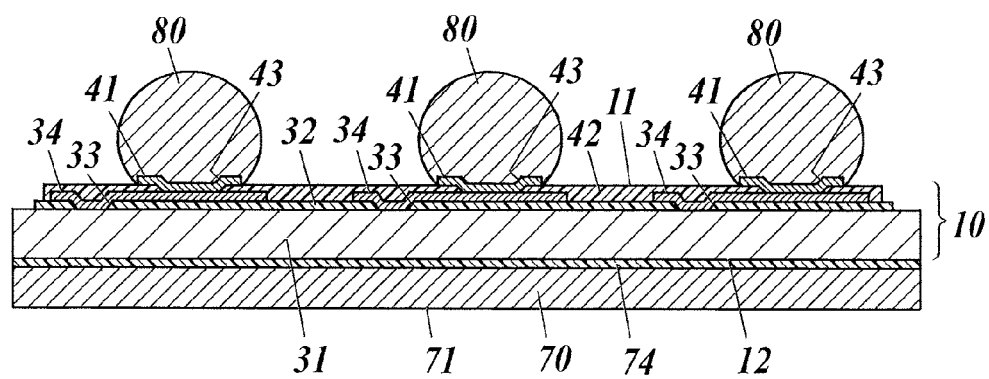
FIG. 10 is a cross-sectional view of a semiconductor device.

FIG. 10 is a cross-sectional view of the semiconductor device 1 when the chip body 10 is a CSP with rewiring layers and UBM layers.

With reference to FIG. 10, the chip body 10 includes a device substrate 31, an insulating film 32, multiple rewiring layers 34, multiple UBM layers 41, and a protective layer 42.

Since the device substrate 31, the insulating film 32, the openings 33, and rewiring layers 34 shown in FIG. 10 are the same as in FIG. 9, their description is omitted.

The protective layer 42 is formed on the rewiring layers 34 disposed on the insulating film 32 to cover the rewiring layers 34. The protective layer 42 is in a direct contact with the rewiring layers 34. The protective layer 42 is composed of an epoxy, a polyimide, or any other resin. The protective layer 42 is formed by curing the photosensitive resin.

The protective layer 42 has multiple openings 43 formed. The openings 43 overlap with the ends of the rewiring layers 34 (more specifically, lands). Since the protective layer 42 is composed of a photosensitive resin, the protective layer 42 and the openings 43 are formed through exposure and development processes.

Each rewiring layer 34 has an end (more specifically, a land) provided with a thin UBM layer 41 thereon. The UBM layer 41 is connected to the corresponding rewiring layer 34 within the corresponding opening 43. Since the UBM layer 41 is larger than the opening 43, the peripheral edges of the UBM layer 41 extend beyond the opening 43 to partially cover the protective layer 42. The UBM layer 41 is so-called an under-bump-metallization layer. The UBM layer 41 is a laminate that includes a base metal layer (seed layer) and a conductor layer (plated layer) grown thereon. The base metal layer is a thin copper (Cu) film, a thin titanium (Ti) film, a laminate of thin titanium and copper films, or any other thin metal film. The conductor layer is plated with copper or other metal. The base metal layer of the UBM layer 41 is in a close contact with the protective layer 42.

Each UBM layer 41 is provided with a solder bump 80 thereon. The solder bump 80 is physically connected to the UBM layer 41 to electrically connect the solder bump 80 to the UBM layer 41.

The surface 42a of the protective layer 42 and the surfaces of the UBM layers 41 together correspond to the first main face 11 of the chip body 10.

As described above, each solder bump 80 is of an overhang type (see FIGS. 1 and 6) or a hemisphere type (see FIG. 5). For the solder bumps 80 of an overhang type, the overcoat layer 14 is preferably disposed on the surface 42a of the protective layer 42. The protective layer 36 and the overcoat layer 14 may be integrated.

Even if the shrinkage of the insulating film 32 and protective layer 42 generates a bending moment in the chip body 10, the reinforcing layer 70 on the second main face 12 of the chip body 10 can successfully prevent the flexure of the chip body 10 against such a bending moment.

Figure 11:
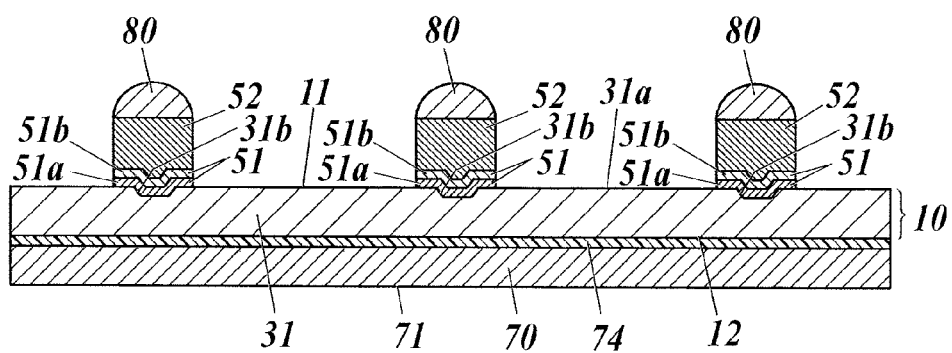
FIG. 11 is a cross-sectional view of a semiconductor device.

FIG. 11 is a cross-sectional view of the semiconductor device 1 when the chip body 10 is a CSP with terminals.

With reference to FIG. 11, the chip body 10 includes a device substrate 31, multiple base metal layers 51, and multiple pillar terminals 52.

Since the device substrate 31 shown in FIG. 11 is the same as that shown in FIG. 9, the description of the device substrate 31 shown in FIG. 11 is omitted.

As described above, the surface 31a of the device substrate 31 (more specifically, a passivation film) has openings 31b. Like the CSP with rewiring layers and pillar terminals shown in FIG. 9 or the CSP with rewiring layers and UBM layers shown in FIG. 10, an insulating film 32 composed of an epoxy, a polyimide, or any other resin may be formed on the surface 31a of the device substrate 31 and openings may be formed on the insulating film 32 at the positions of the openings 31b. In this case, the base metal layers 51 (UBM layers) are in a direct contact with the insulating film 32.

The base metal layers 51 are connected to pads at the openings 31b. The edges of each base metal layer 51 extend beyond the corresponding opening 31b to partially cover the surface 31a of the device substrate 31 (more specifically, the passivation film). The base metal layer 51 is a thin laminate film of a titanium layer 51a and a copper layer 51b.

The pillar terminals 52 are formed on the base metal layers 51. Each pillar terminal 52 is thicker (or taller) than the corresponding base metal layer 51 and is grown by electroplating.

The surface 31a of the device substrate 31 (in particular, the passivation film) and the surfaces of the pillar terminals 52 together correspond to the first main face 11 of the chip body 10.

Each pillar terminal 52 has a top surface 52a provided with a solder bump 80 thereon. The solder bump 80 is physically connected to the top surface 52a of the pillar terminal 52 to electrically connect the solder bump 80 to the pillar terminal 52.

The solder bumps 80 are of a hemisphere type. The solder bumps 80 of an overhang type may be used. The surface 31a of the device substrate 31 is not covered with an overcoat layer but is exposed.

Even if integrated circuit (s) and the passivation films formed on the surface 31a of the device substrate 31 generates a bending moment in the chip body, the reinforcing layer 70, disposed on the second main face 12 of the chip body 10, can successfully prevent the warpage of the chip body 10 against such as bending moment.

The bonding layer 74 may cover the outer periphery of the chip body 10. More specifically, as shown by the dotted line in FIG. 7, the bonding layer 74 may cover at least the entire outer periphery of the device substrate 31 of the outer periphery 13 of the chip body 10. This configuration is preferred in the case where the outer shape of the reinforcing layer 70 is slightly larger than that of the chip body 10. Alternatively, the bonding layer 74 covering the entire outer periphery of the device substrate 31 may also cover a layer stacked on the opposite surface of the reinforcing layer 70 of the device substrate 31.

This configuration can protect the outer periphery of the device substrate 31. In particular, the device substrate 31 provided with a low-k multilayer wiring structure has a fragile outer periphery. To cope with this problem, the following conventional method is used: Grooves are formed in the outer periphery of a device substrate by laser half-dicing and the grooves are filled with a resin to protect the outer periphery of the low-k multilayer wiring structure (laser grooving). The entire cover of the outer periphery of the device substrate 31 with the bonding layer 74 can enhance the reliability of the semiconductor device 1 provided with a low-k multilayer wiring structure economically without using a special process since the formed bonding layer 74 can bond the reinforcing layer 70 to the device substrate and protect the outer periphery of the device substrate 31 at the same time.

The chip body 10 should not be limited to the CSP with rewiring layers and pillar terminals, the CSP with rewiring layers and UBM layers, or the CSP with terminals, as shown in FIGS. 9 to 11, respectively. For example, any external connections having a shape different from that of the terminals 35 or 41 may be used for the terminals 35 or 41. Alternatively, the terminals 35 or 41 shown in FIG. 9 or FIG. 10 may be omitted and the solder bumps 80 are formed on the ends of the rewiring layers 34 (lands) to bring the solder bumps 80 into a direct contact with the rewiring layers 34, which function as the terminals. Alternatively, the terminal 35 or 41 shown in FIG. 9 or FIG. 10 may be directly disposed on the pads, which are disposed on the openings 33, without providing the rewiring layers 34. Alternatively, the insulating film 32, the protective layer 36, or the protective layer 42 shown in FIG. 9 or FIG. 10 may be omitted.

Second Embodiment

A method of manufacturing the semiconductor device 1 will now be described.

(1) Wafer Preparing Process (Wafer Fabricating Process)

Figure 12A:
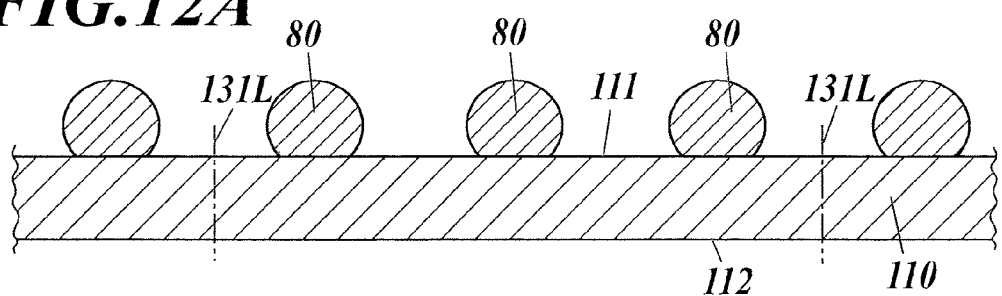
FIGS. 12A to 12D are manufacturing process diagrams of a semiconductor device.

A wafer 110 provided with multiple solder bumps 80 is prepared, as shown in FIG. 12A. The wafer 110 is not yet divided into chip bodies 10. The wafer 110 can be manufactured by different methods depending on the type of the chip body 10: a CSP with rewiring layers and pillar terminals, a CSP with rewiring layers and UBM layers, or a CSP with terminals. The method of manufacturing the wafer 110 will now be described for each type.

Figure 14A:
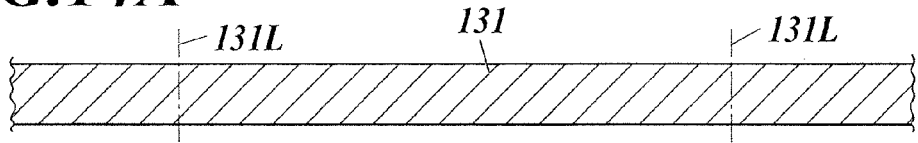
FIGS. 14A to 14G are manufacturing process diagrams of a semiconductor device.

(1-1) In the Case of the Chip Body 10 being a CSP with Rewiring Layers and Pillar Terminals With reference to FIG. 14A, a device wafer 131 is prepared. The device wafer 131 is a substrate larger than a device substrate 31 and is divided into multiple device substrates 31 along designed dividing lines 131L (also called "dicing lines"). The device wafer 131 is thicker than the device substrate 31 and thicker than the total length from the surface of the reinforcing layer 70 to the first main face 11 of the chip body 10. The device wafer 131 is composed of a semiconductor wafer, such as silicon, and is provided with integrated circuits on its surface and a passivation film covering the integrated circuits. The semiconductor manufacturing process involves a front-end process and a back-end process. The device wafer 131 is fabricated in the front-end process.

Figure 14B:
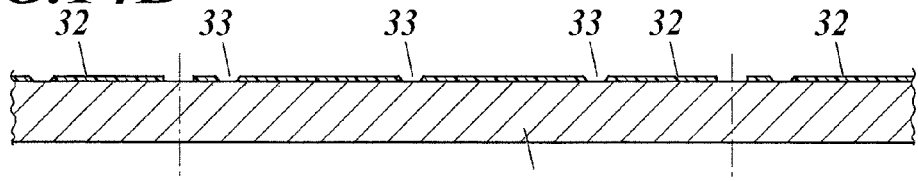

With reference to FIG. 14B, the device wafer 131 is coated with a photosensitive resin that is then exposed and developed to form an insulating film 32 having openings 33. The resulting insulating film 32 has a grid pattern and is partitioned by the designed dividing lines 131L. The insulating film 32 is preferably composed of a resin having a small shrinkage rate during the curing reaction. Selecting a material with a low curing temperature for the insulating film 32 can reduce a gap between the curing temperature and the normal temperature, thereby reducing shrinkage of the insulating film 32 during the curing operation. Selecting a material with a small linear expansion coefficient for the insulating film 32 can reduce the shrinkage of the insulating film 32 during the curing operation.

Figure 14C:
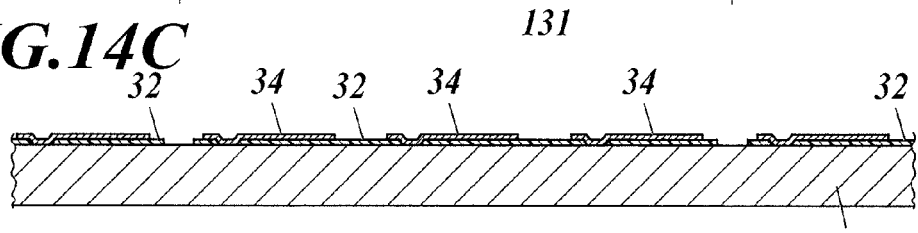

With reference to FIG. 14C, the rewiring layers 34 are formed on the insulating film 32 by a subtractive or additive process (for example, a full-additive, semi-additive, or partly additive process).

Figure 14D:
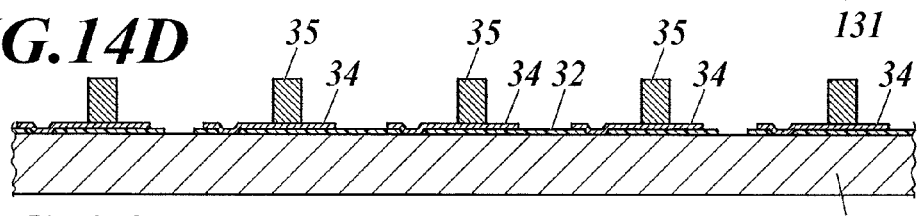

After a resist is exposed and developed, electroplating is performed through the resist mask to form pillar terminals 35 on the ends of the rewiring layers 34 (lands), and then the resist is removed (see FIG. 14D).

Figure 14E:
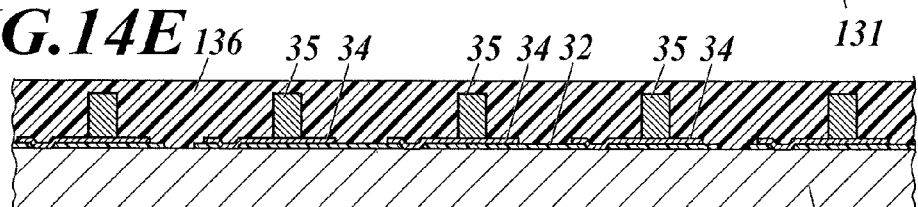

With reference to FIG. 14E, a protective layer 136 is formed on the insulating film 32 and the rewiring layers 34 to embed the pillar terminals 35 in the protective layer 136. More specifically, a resin is applied to the insulating film 32 and the rewiring layers 34 by spin coating or printing and cured to form the protective layer 136. The protective layer 136 is not yet divided. Dividing the protective layer 136 along the designed dividing lines 131l, can produce multiple protective layers 36 from the protective layer 136 (see FIG. 9).

The protective layer 136 is preferably composed of a resin having a low shrinking rate during the curing reaction. Selecting a material with a low curing temperature for the protective layer 136 can reduce a gap between the curing temperature and the normal temperature, thereby reducing shrinkage during the curing operation. Selecting a material with a small linear expansion coefficient for the protective layer 136 can reduce the shrinkage of the protective layer 136 during the curing operation. For the protective layer 136 containing fillers, the linear expansion coefficient of the protective layer 136 can be reduced by increasing the content of the fillers, thereby reducing the shrinkage of the protective layer 136 during the curing operation.

Figure 14F:
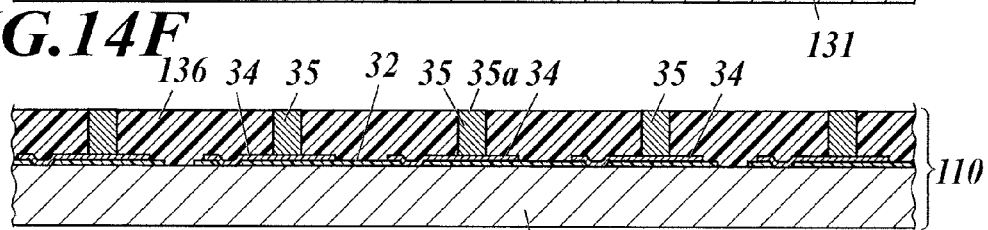

With reference to FIG. 14F, the surface of the protective layer 136 is ground or polished to thin the protective layer 136 and expose the top surfaces 35a of the pillar terminals 35. The top surfaces 35a of the pillar terminals 35 are also ground or polished.

Figure 14G:
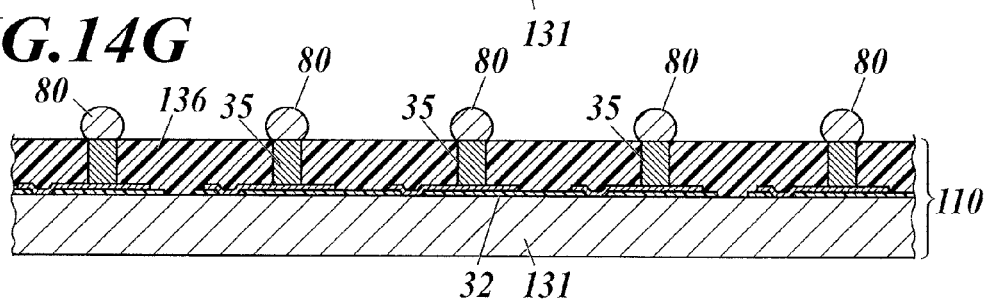

With reference to FIG. 14G, solder bumps 80 are formed on the top surfaces 35a of the pillar terminals 35. The solder bumps 80 are of an overhang type or a hemisphere type.

Despite a bending moment generated in the device wafer 131 in the above process of manufacturing the insulating film 32 and the protective layer 136, the thick device wafer 131 barely warps.

Figure 15A:
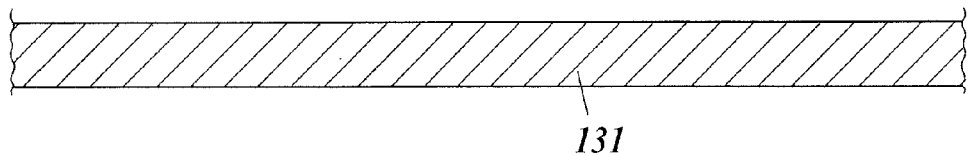
FIGS. 15A to 15F are manufacturing process diagrams of a semiconductor device.
Figure 15B:
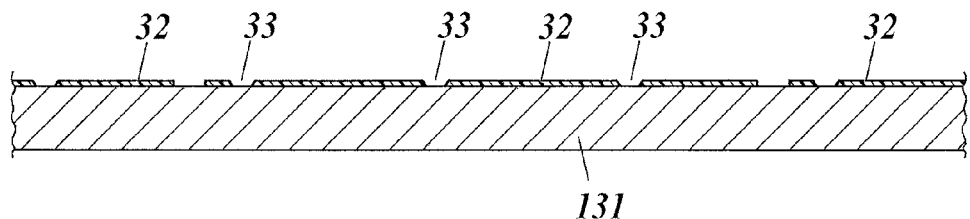
Figure 15C:
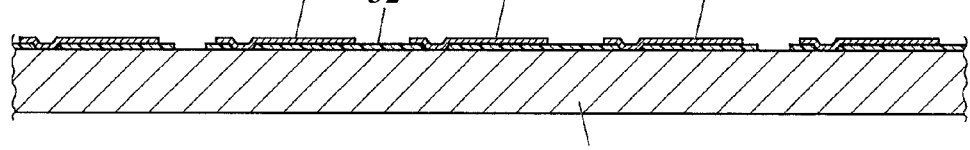

(1-2) In the Case of the Chip Body 10 being a CSP with Rewiring Layers and UBM Layers A device wafer 131 is prepared, as shown in FIG. 15A. With reference to FIG. 15B, the device wafer 131 is coated with a photosensitive resin that is then exposed and developed to form an insulating film 32 having openings 33. With reference to FIG. 15C, rewiring layers 34 are formed by a subtractive or additive process. The process shown in FIGS. 15A to 15C is the same as that shown in FIGS. 14A to 14C.

Figure 15D:
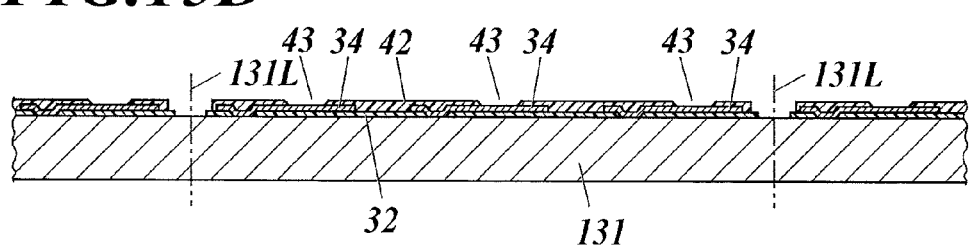

With reference to FIG. 15D, the device wafer 131 is coated with a photosensitive resin that is then exposed and developed to form a protective layer 42 having openings 43. The protective layer 42 has a grid pattern and is partitioned by the designed dividing lines 131L.

Figure 15E:
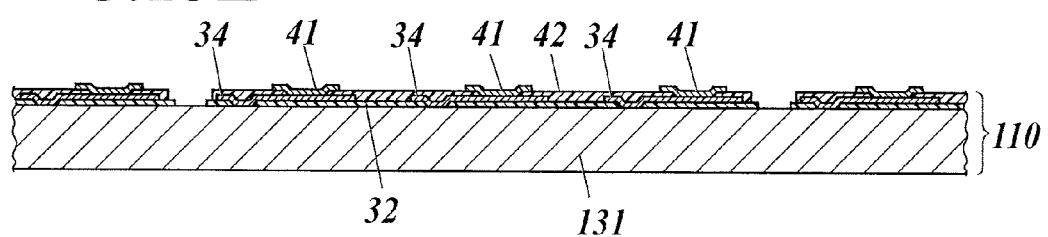

With reference to FIG. 15E, the UBM layers 41 are formed within and around the openings 43 by a subtractive or additive process (for example, a full-additive, semi-additive, or partly-additive process).

Figure 15F:
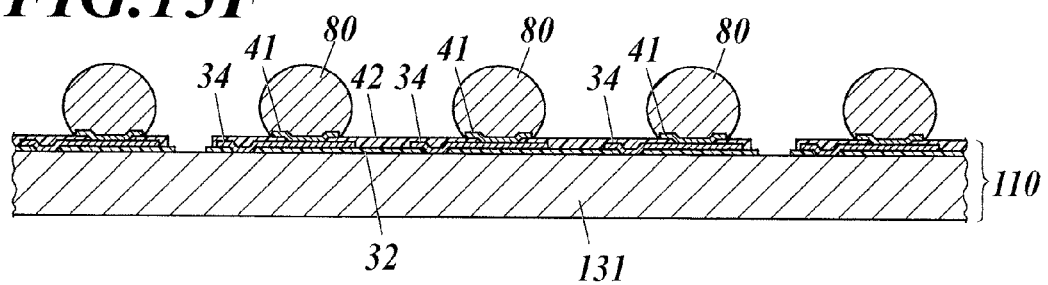

With reference to FIG. 15F, the solder bumps 80 are formed on the UBM layers 41. The solder bumps 80 are of an overhang type or a hemisphere type.

Despite a bending moment generated in the device wafer 131 in the above process of manufacturing the insulating film 32 and the protective layer 42, the thick device wafer 131 barely warps.

(1-3) In the Case of the Chip Body 10 being a Chip with Terminals

Figure 16A:
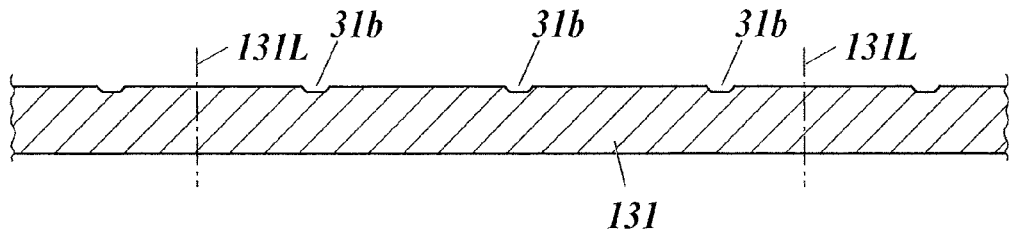
FIGS. 16A to 16E are manufacturing process diagrams of a semiconductor device.

A device wafer 131 is prepared, as shown in FIG. 16A. Similar to Step (1-2), the device wafer 131 is coated with a photosensitive resin that is then exposed and developed to form an insulating film 32 having openings 33. The openings 33 are aligned to the openings 31b.

Figure 16B:
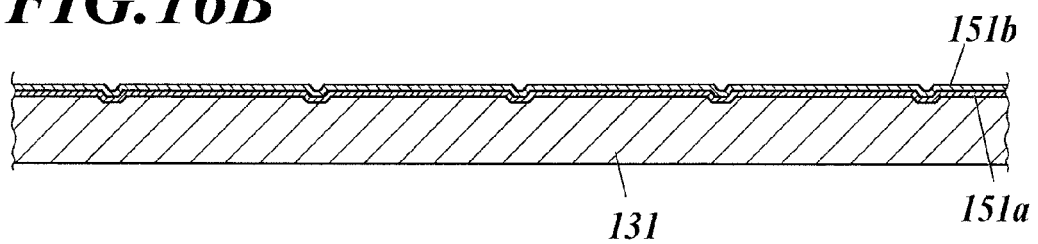

With reference to FIG. 16B, a titanium layer 151a is formed to fully cover the surface of the device wafer 131 by vapor phase epitaxial growth or plating and then a copper layer 151b is formed to fully cover the surface of the titanium layer 151a by vapor phase epitaxial growth or plating.

Figure 16C:
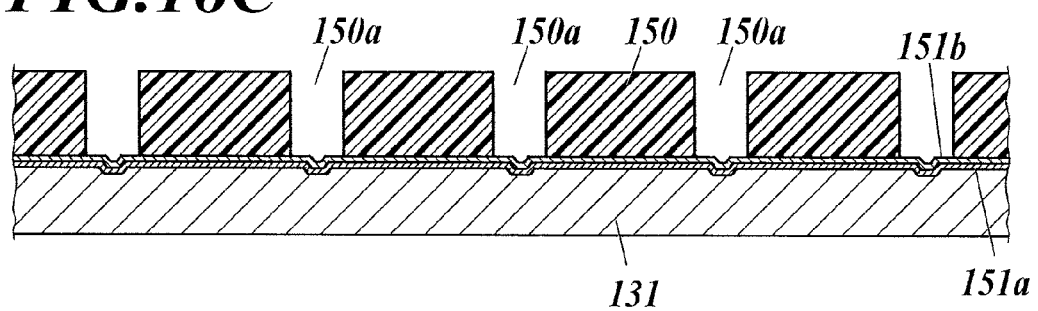

With reference to FIG. 16C, a resist layer 150 (a desiccated liquid resist or a dry-film resist) is formed on the copper layer 151b and then exposed and developed to form multiple openings 150a on the resist layer 150 at the positions overlapped with the openings 31b of the device wafer 131. The openings 31b have a smaller diameter than the openings 150a and stay within the openings 150a in the top view.

Figure 16D:
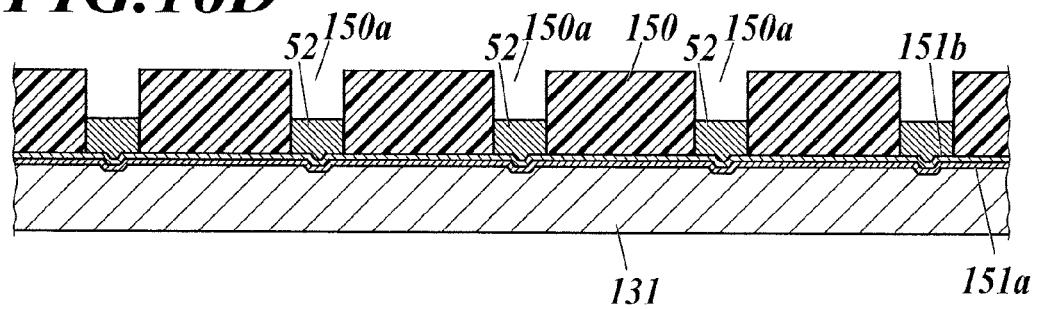

With reference to FIG. 16D, electroplating is performed through a mask of the resist layer 150 to grow the pillar terminals 52 on the copper layer 151b in the openings 150a. The pillar terminals 52 are significantly higher or thicker than the copper layer 151b and the titanium layer 151a.

Figure 16E:
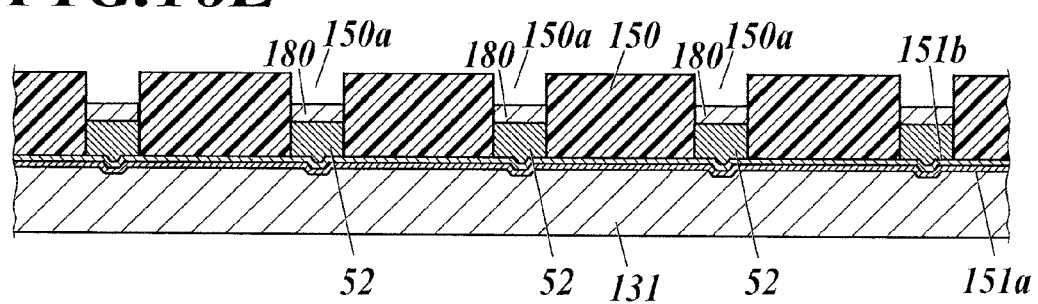

With reference to FIG. 16E, electroplating is performed through a mask of the resist layer 150 to grow solder layers 180 on the pillar terminals 52 in the openings 150a.

Figure 17F:
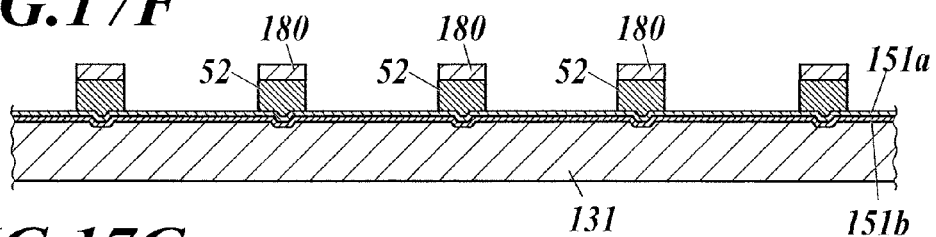
FIGS. 17F to 17K are manufacturing process diagrams of a semiconductor device.

With reference to FIG. 17F, the resist layers 150 are removed.

Figure 17G:
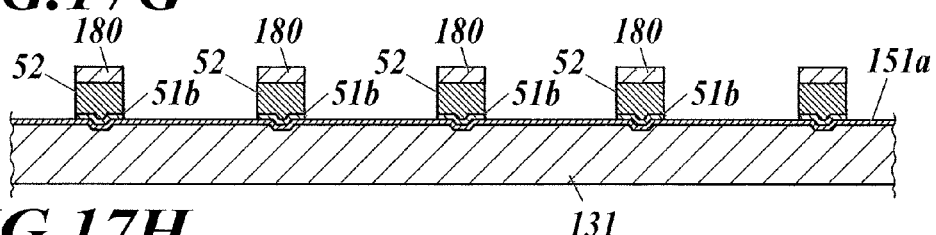

With reference to FIG. 17G, the bare portions, not overlapped with the pillar terminals 52, of the copper layer 151b are removed by etching. The remaining portions of the copper layer 151b correspond to the copper layers 51b of the base metal layer 51. Although the surfaces of the pillar terminals 52 are slightly etched during etching of the copper layer 151b, the pillar terminals 52 are left since the copper layer 151b is significantly thinner than the pillar terminals 52.

Figure 17H:
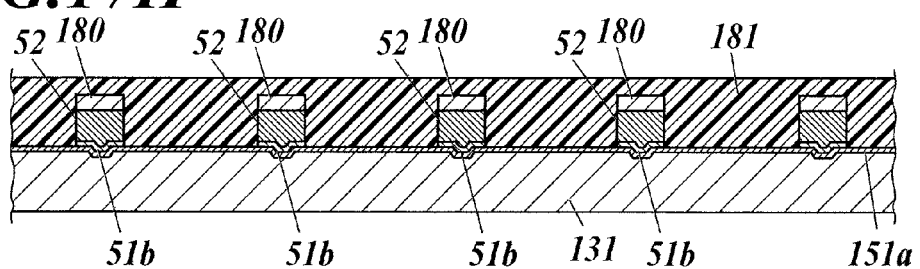

With reference to FIG. 17H, a flux layer 181 having a thickness greater than the total thickness of the pillar terminals 52, the solder layers 180, and the copper layers 51b is formed on the titanium layer 151a to embed the pillar terminals 52, the solder layers 180, and the copper layer 51b in the flux layer 181.

Figure 17I:
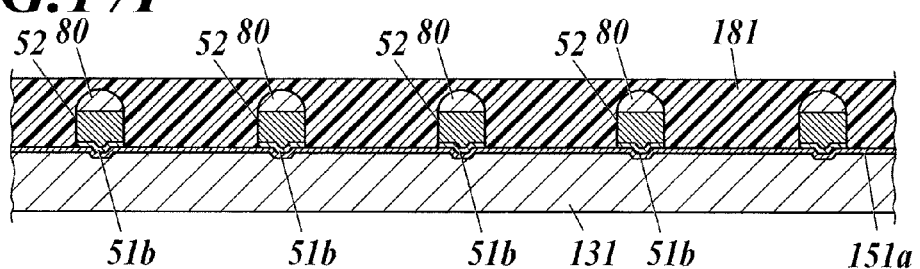

With reference to FIG. 17I, the solder layers 180 are melted by reflow, changed into a hemisphere by way of surface tension, and then solidified into solder bumps 80 of a hemisphere type.

Figure 17J:
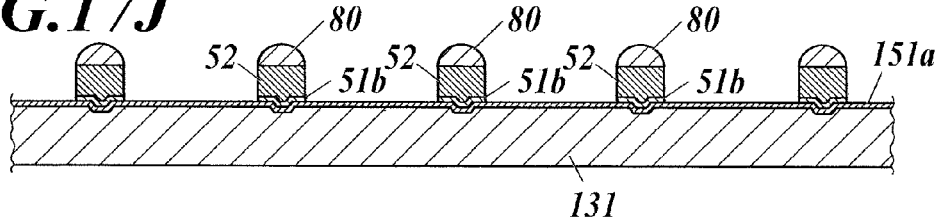

With reference to FIG. 17J, the flux layer 181 is removed.

Figure 17K:
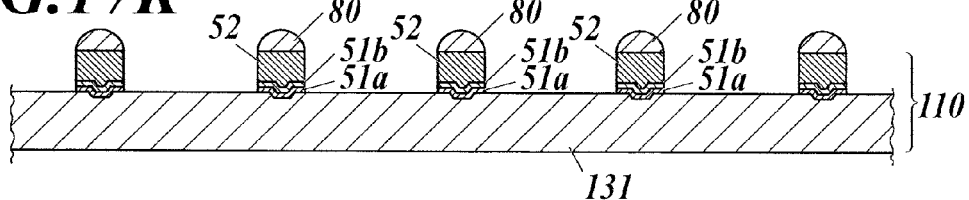

With reference to FIG. 17K, the bare portions, not overlapped with the pillar terminals 52, of the titanium layer 151a are removed by etching. The remaining portions of the titanium layer 151a correspond to the titanium layers 51a of the base metal layer 51.

Despite a bending moment generated in the device wafer 131 in the above process, the thick device wafer 131 barely warps.

(2) Support Plate Bonding Process

Figure 12B:
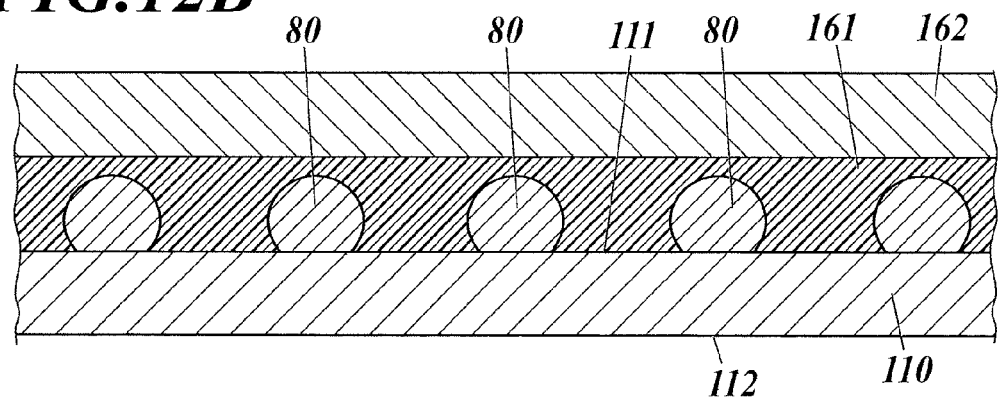

With reference to FIG. 12B, after preparation of the wafer 110 provided with the multiple solder bumps 80, a support plate 162 is bonded to the first main face 111 (the surface having the solder bumps 80 disposed thereon) of the wafer 110 with an adhesive layer 161. The solder bumps 80 are embedded in the adhesive layer 161. To ensure a smooth process flow, the support plate preferably has substantially the same shape as that of the wafer 110. A laser light absorbing layer, which is destructed by laser light, may be disposed between the adhesive layer 161 and the support plate 162.

The support plate 162 may be a transparent plate that can transmit laser light, for example, a glass plate or an opaque plate that can block laser light, for example, a silicon substrate. Alternatively, the support plate 162 may be composed of a resin. The support plate 162 has desired rigidity to prevent warpage.

The adhesive layer 161 is composed of a photocurable, thermosetting, or thermoplastic resin.

In the case of the adhesive layer 161 composed of a photocurable resin, a liquid photocurable resin is applied to the wafer 110 and/or the support plate 162 and then cured with light, in particular, ultraviolet rays to bond the support plate 162 to the wafer 110.

In the case of the adhesive layer 161 composed of a thermosetting resin, a liquid thermosetting resin is applied to the wafer 110 and/or the support plate 162 and then cured by heat to bond the support plate 162 to the wafer 110.

In the case of the adhesive layer 161 composed of a thermoplastic resin, a support plate 162 pre-bonded with the adhesive layer 161 is melted by heat, attached to the first main face 111 of the wafer 110, and then solidified by natural cooling or forced cooling. The support plate 162 which is pre-bonded with a thermoplastic adhesive layer 161 and composed of a resin is, for example, ICROS tape from Mitsui Chemicals Group (a registered trade mark of Mitsui Chemicals Tohcello Inc.).

A liquid resin is preferably applied to the wafer 110 two times. More specifically, a first liquid resin layer is formed on the wafer 110 until the liquid resin covers the top surfaces of the solder bumps 80 and then cured by heat or light. A second liquid resin layer is formed on the cured resin layer and is also cured by heat or light. The double application process can produce the adhesive layer 161 with an even thickness.

(3) Wafer Thinning Process

Figure 12C:
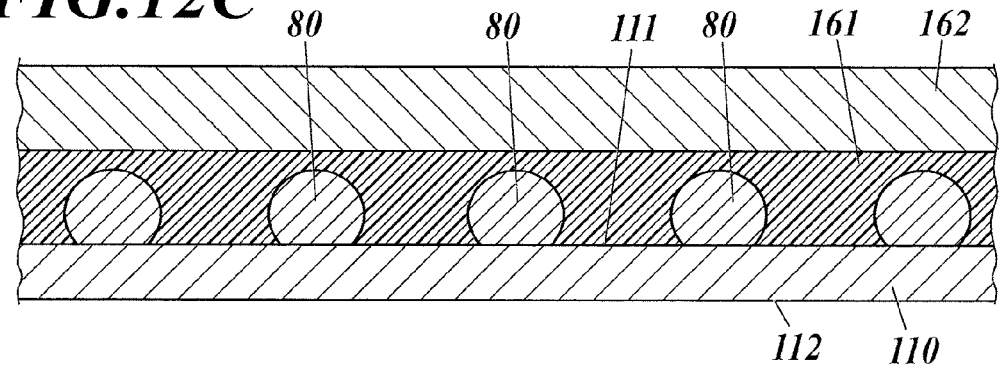

With reference to FIG. 12C, the second main face 112 of the wafer 110 (the rear surface of the device wafer 131) is polished or ground by a grinder to thin the wafer 110. The second main face 12 is preferably mirror-finished by dry polishing.

The wafer 110, which is supported by the support plate 162, does not warp even though the wafer 110 is thinned.

(4) Wafer Dividing Process

Figure 12D:
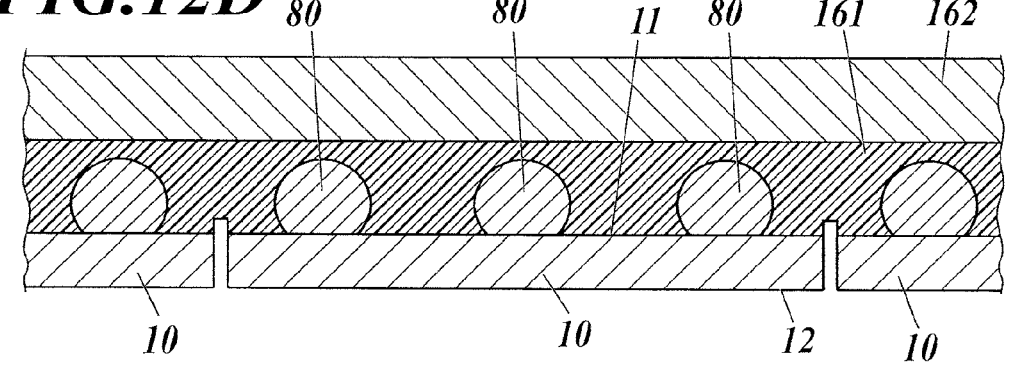

With reference to FIG. 12D, the wafer 110 is divided into multiple chip bodies 10 along the designed dividing lines 131L. The wafer 110 may be cut by any mechanical, chemical, or thermal means. The mechanical cutting refers to cutting of the wafer 110 with a blade and is generally referred to as blade dicing. The chemical cutting refers to cutting of the wafer 110 by plasma or etching along the designed dividing lines 131L. Thermal cutting refers to cutting of the wafer 110 by radiating a high-energy medium, for example, laser beam to the designed dividing lines 131L of the wafer 110.

(5) Reinforcing Layer Preparing Process

Figure 13E:
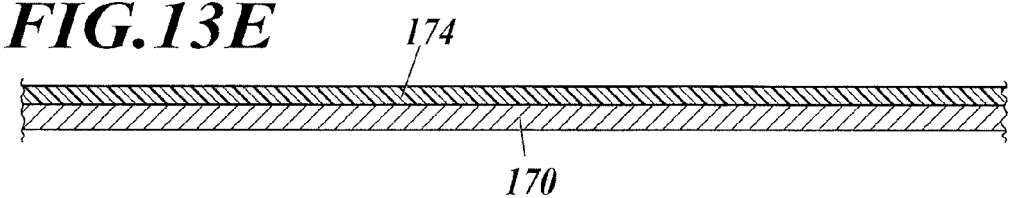
FIGS. 13E to 13I are manufacturing process diagrams of a semiconductor device.

With reference to FIG. 13E, a reinforcing plate 170 which is thinner than a reduced thickness is prepared and a bonding layer 174 is formed on the reinforcing plate 170 by any coating or bonding process. The reinforcing plate 170 preferably has an elastic modulus higher than that of the device wafer 131 (in particular, the wafer before integrated circuits are formed) In addition, the reinforcing plate 170 preferably has rigidity higher than the device wafer having a thickness corresponding to the total thickness of the reinforcing plate 170 and the bonding layer 174. Let the thickness of the reinforcing plate 170 be t1 and the thickness of the bonding layer 174 be t2, and t1+t2=T. The reinforcing plate 170 having a configuration that satisfies the following condition is fabricated: (the rigidity of a semiconductor substrate with a thickness of T)<(the rigidity of the reinforcing plate 170 with a thickness of t1). Since the bending rigidity of the reinforcing plate is proportional to its elastic modulus and the cube of its thickness, the above in equation can be expressed by: (the elastic modulus of semiconductor substrate)$\times T^3$<(the elastic modulus of the reinforcing plate 170)$\times$(t1). Alternatively, a reinforcing plate 170 provided with the bonding layer 174 may be prepared.

Figure 13F:
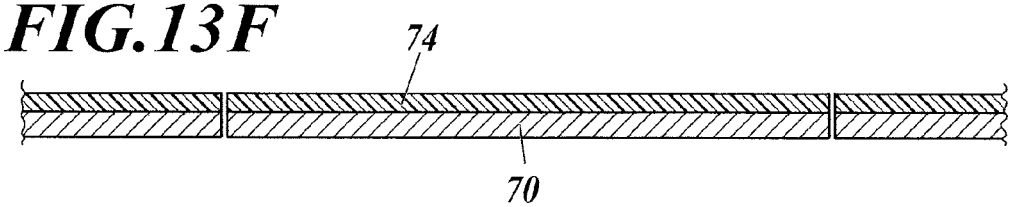

With reference to FIG. 13F, the reinforcing plate 170 and the bonding layer 174 are cut into smaller reinforcing layers 70 and bonding layers 74. The reinforcing plate 170 and the bonding layer 174 may be cut by any mechanical (for example, with a blade), chemical (for example, plasma etching or wet etching), or thermal (for example, with a laser beam) means.

In this embodiment, each reinforcing layer 70 is larger than the chip body 10. More specifically, the horizontal edge of the reinforcing layer 70 is slightly longer than the corresponding edge of the chip body 10 by approximately 10 μm to 50 μm. Alternatively, the reinforcing layer 70 may have the same size as the chip body 10.

(6) Reinforcing Layer Bonding Process

Figure 13G:
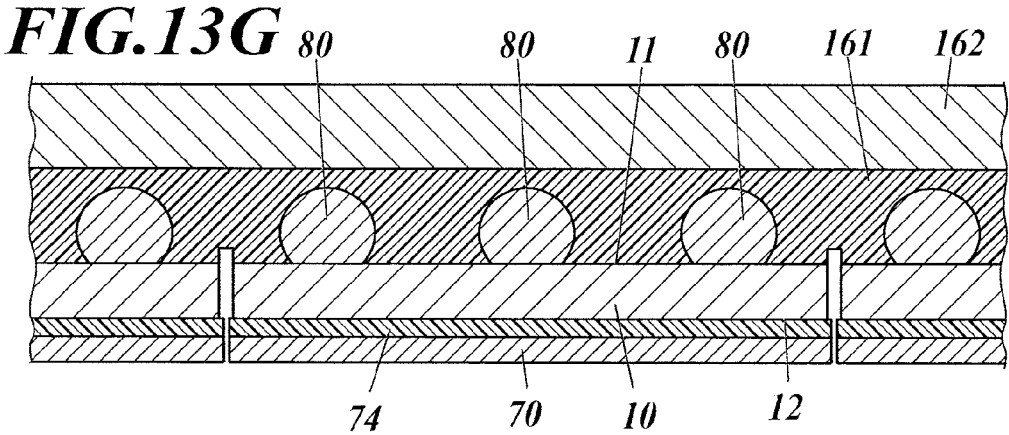

With reference to FIG. 13G, the reinforcing layer 70 is bonded to the second main face 12 of the chip body 10 via the bonding layer 74. Each reinforcing layer 74 may be bonded to the corresponding chip body or the reinforcing layers 74 may be bonded at the same time for every wafer transfer.

A bonding layer 74 composed of a thermosetting resin is cured by heating. At this time, the heat-resistant temperature of the reinforcing layer 70 and the support plate 162 must be higher than the heating temperature (curing temperature of the bonding layer 74). If solder bumps are already formed, the heating temperature must be lower than the melting (reflow) temperature of the solder bumps 80. The heat-resistant temperature of the bonding layer 74 must be higher than the melting (reflow) temperature of the solder bumps 80. If the device substrate 31 includes electronic devices, such as memory cells, which undergo any thermal degradation, the heating temperature (curing temperature of the bonding layer 74) should be lower, for example, 200° C. or less.

If the bonding layer 74 protrudes from the peripheral edge of the reinforcing layer 70, the protruding edge should be preferably removed by ashing (laser or plasma ashing).

Alternatively, the bonding layer 74 may entirely cover the outer periphery of the device substrate 31. In this case, the bonding layer 74 preferably reaches at least part of the lateral sides of the insulating film or the protective layer 36.

Since the chip body 10 has the support plate 162 bonded thereto, the reinforcing layer 70 can be bonded to the chip body 10 without warpage.

(7) Chip Body Transferring Process

Figure 13H:
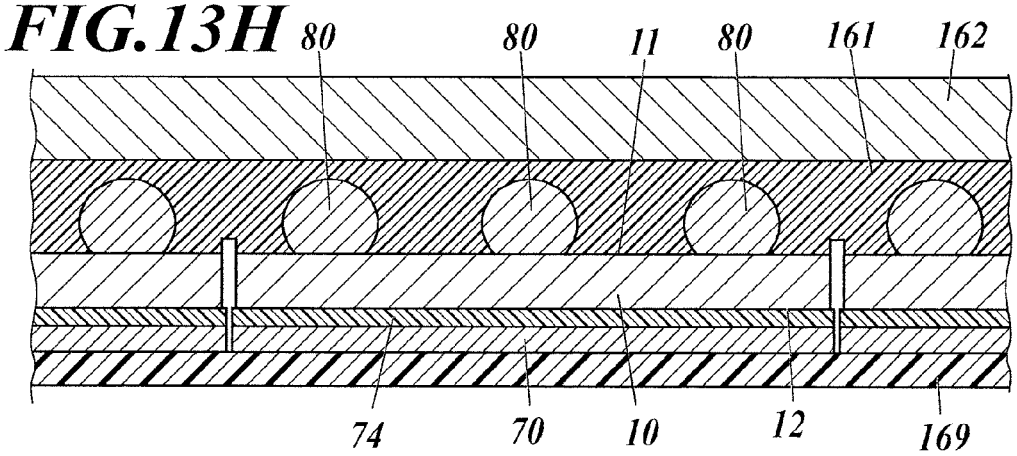

With reference to FIG. 13H, the reinforcing layer 70 is bonded to an adhesive tape 169 (for example, dicing tape). The adhesive tape 169 is surrounded and held by a frame (dicing frame).

(8) Process of Removing Adhesive Layer and Support Plate

Figure 13I:
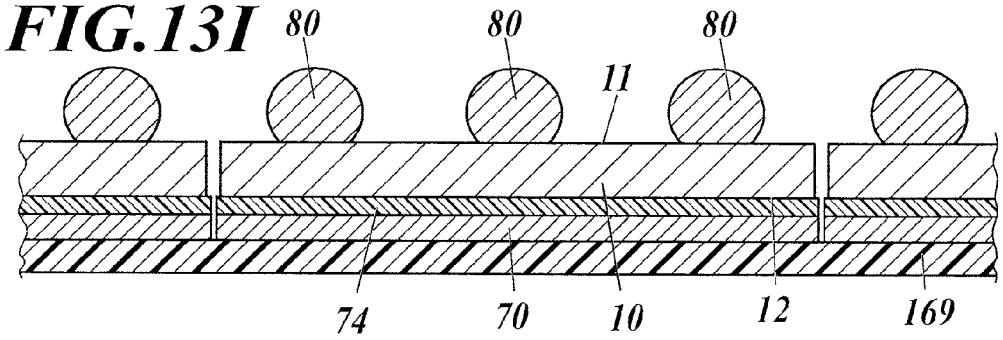

With reference to FIG. 13I, the support plate 162 and the adhesive layer 161 are removed from the chip body 10. Even after the support plate 162 and the adhesive layer 161 are removed, the reinforcing layer 70 bonded to the second main face 12 of the chip body 10 can prevent large warpage of the chip body 10 caused by a bending moment.

The adhesive layer 161 may be removed by one of the following two methods: The entire adhesive layer 161 is removed from the first main face 11 of the chip body 10; or only the upper part of the adhesive layer 161 is removed while the lower part of the adhesive layer 161 is left on the first main face 11 of the chip body 10 in the form of an overcoat layer 14 (see FIG. 6). After the lower part of the adhesive layer 161 is left, the lower part of the adhesive layer 161 is mechanically, chemically or thermally cut into multiple overcoat layers 14 along the designed dividing line 131L.

The support plate 162 and the adhesive layer 161 may be removed from the chip body 10 by one of the following two methods: The support plate 162 is removed first and then the adhesive layer 161 is removed from the chip body 10; or the adhesive layer 161 and the support plate 162 attached thereto are removed at the same time from the chip body 10. The support plate 162 may be removed from the adhesive layer 161 by, for example, thermal, mechanical, chemical, or optical means. The support plate 162 may be removed from the adhesive layer 161 by thermal, mechanical, chemical removal, or optical means. The adhesive layer 161 may be removed from the chip body 10 by, for example, thermal, mechanical, chemical, or optical means.

Specific examples of the removal of the support plate 162 and the adhesive layer 161 will now be described.

(8-1)

Figure 18A:
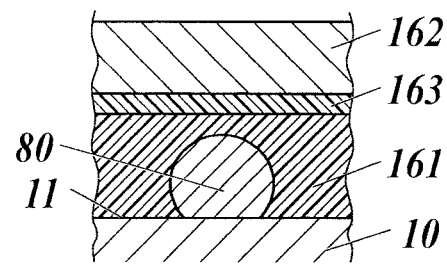
FIGS. 18A to 18D are manufacturing process diagrams of a semiconductor device.

With reference to FIG. 18A, a laser light absorbing layer 163 is disposed between the support plate 162 and the adhesive layer 161. The support plate 162 can transmit laser light.

Figure 18B:
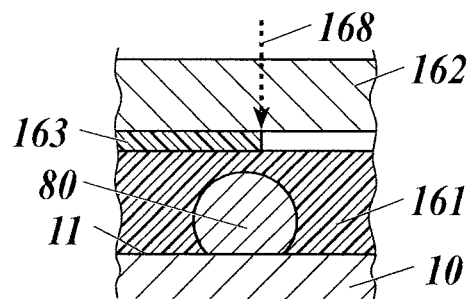
Figure 18C:
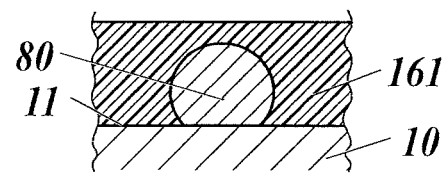

With reference to FIG. 18B, laser light 168 is incident on the laser light absorbing layer 163 through the support plate 162 from above the support plate 162, and destructs the laser light absorbing layer 163 by its energy. With reference to FIG. 18C, the support plate 162 is removed from the adhesive layer 161.

Figure 18D:
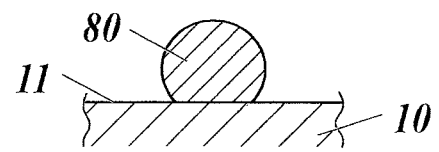

With reference to FIG. 18D, the adhesive layer 161 is removed from the chip body 10 mechanically or chemically by solving the adhesive layer 161 with a solvent. The adhesive layer 161 composed of a photocurable acrylic resin is preferably removed by any mechanical means. The adhesive layer 161 composed of a thermoplastic hydrocarbon resin is preferably removed by any chemical means.

(8-2)

Figure 19A:
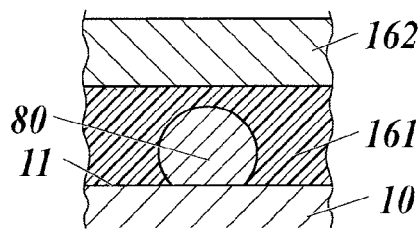
FIGS. 19A to 19C are manufacturing process diagrams of a semiconductor device.

With reference to FIG. 19A, the adhesive layer 161, composed of a thermoplastic resin, is melted by heat.

Figure 19B:
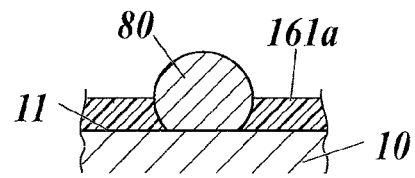

With reference to FIG. 19B, before the adhesive layer 161 is cured, the adhesive layer 161 is removed from the chip body 10 together with the support plate 162. In this case, the support plate 162 may be removed from the chip body 10 by sliding the support plate 162 on the first main face 11 of the chip body 10 or by pulling the support plate 162 away from the chip body 10 in the direction perpendicular to the first main face 11 of the chip body 10. A residue 161a of the adhesive layer 161 is left on the chip body 10 during the removal.

Figure 19C:
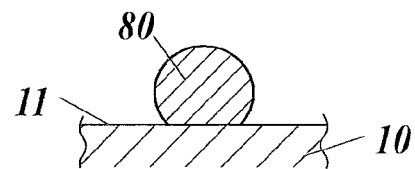

With reference to FIG. 19C, the residue 161a of the adhesive layer 161 is removed by cleaning the first main face 11 of the chip body 10 with a cleaner, including a solvent.

(8-3)

Figure 20A:
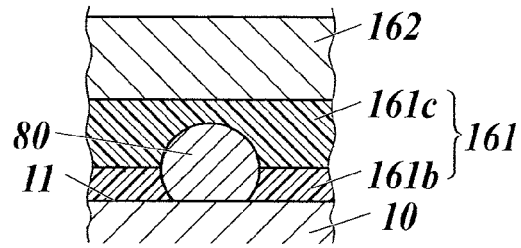
FIGS. 20A to 20C are manufacturing process diagrams of a semiconductor device.

With reference to FIG. 20A, the adhesive layer 161 consists of a highly adhesive layer 161b and a less adhesive layer 161c. The highly adhesive layer 161b is adjacent to the chip body 10 and has a higher rigidity and adhesive force than the less adhesive layer 161c. The less adhesive layer 161c is adjacent to the support plate 162.

Figure 20B:
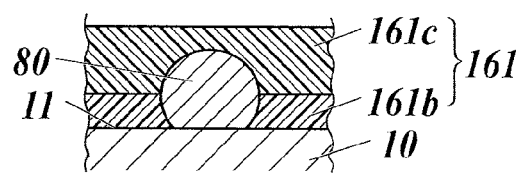

With reference to FIG. 20B, when the support plate 162 is removed from the chip body 10, the less adhesive layer 161c is removed from the support plate 162.

Figure 20C:
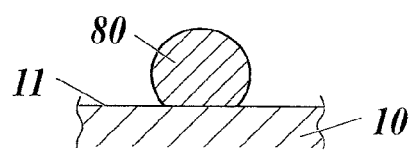

With reference to FIG. 20C, the adhesive layer 161 (the highly adhesive layer 161b and the less adhesive layer 161c) is chemically removed from the chip body 10 by dissolving the highly adhesive layer 161b with a solvent. Alternatively, the less adhesive layer 161c may be dissolved with the solvent.

In the case of the mechanical removal (peeling off) of the adhesive layer 161 from the chip body 10, the lower part of the adhesive layer may not be removed properly for the solder bumps 80 of an overhang type. The solder bumps 80 of a hemisphere type can avoid this problem. The solder bumps 80 of an overhang type with their lower portions embedded in an overcoat layer 14 can also avoid this problem because the parts, protruding from the overcoat layer 14, of the solder bumps 80 are of a hemisphere type. The overcoat layer 14 also helps reinforce the lower portions of the solder bumps 80 to improve reliability at the time of implementation. Alternatively, the adhesive layer 161 may be partially left in the form of the overcoat layer 14.

The mechanical removal is more efficient and economical than the chemical removal. A configuration that enables mechanical removal is preferred.

Third Embodiment

A method of manufacturing the semiconductor device 1 will now be described.

"(1) Wafer preparing process", "(2) Support plate bonding process", "(3) Wafer thinning process", and "(5) Reinforcing layer preparing process" are performed as in the second embodiment (see FIGS. 12A to 12C, 13E to 13F, and 14A to 17K).

(1a) Reinforcing Layer Bonding Process

Figure 21A:
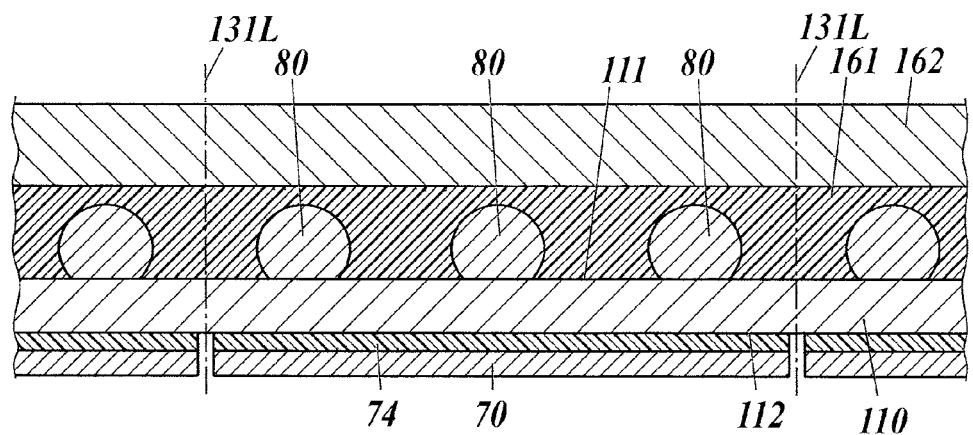
FIGS. 21A to 21B are manufacturing process diagrams of a semiconductor device.
Figure 21B:
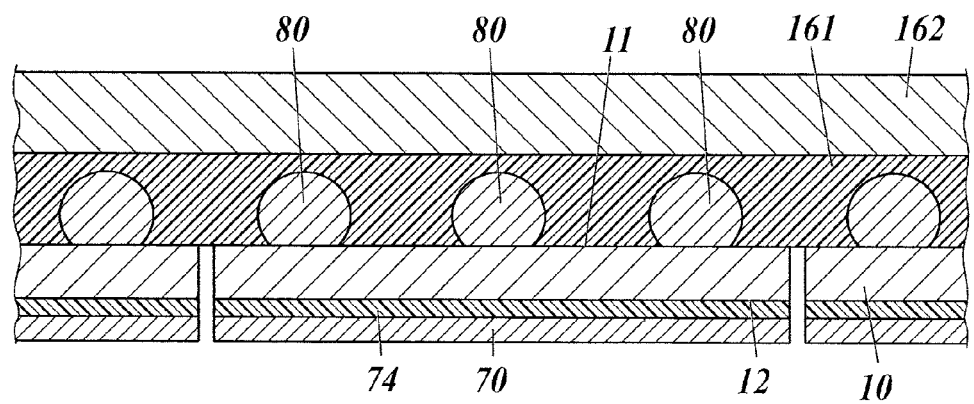

With reference to FIG. 21A, the reinforcing layer 70 is bonded to the second main face 112 of the wafer 110 via the bonding layer 74 such that the reinforcing layer 70 is positioned not across any designed dividing line 131L but within a grid cell defined by the designed dividing lines 131L.

The detailed description of the bonding of the reinforcing layer 70 is omitted as it is the same as that of "(6) Reinforcing layer bonding process" in the second embodiment.

(2a) Wafer Dividing Process

The wafer 110 is cut by chemical means. More specifically, the wafer 110 is divided into multiple chip bodies 10 along the designed dividing lines 131L by etching the bare portions, not covered with the reinforcing layer 70, of the wafer 110 with plasma or an etching solution through a mask of the reinforcing layer 70. The use of the reinforcing layer 70 as a mask results in the chip body 10 having the same shape and size as the reinforcing layer 70. The wafer 110 can be cut, even if the bonding position of the reinforcing layer 70 may be slightly deviated from its designed position. The reinforcing layer 70, which also serves as a mask, enables efficient and economical chemical cutting.

The chemical cutting of the wafer 110 enables narrow-width dicing of, for example, 50 μm or less by reducing the interval between the designed dividing lines 131L of the wafer 110. If the thickness of the wafer 110 (a distance from the second main face 112 to first main face 111) is, for example, 100 μm and the interval between the adjacent reinforcing layers 70 is, for example, 20 μm or more, the wafer 110 can be cut by plasma. The narrow-width dicing can increase the number of chips available from a wafer to enhance the productivity.

A reactive ion etching (RIE) process using plasmanized $SF_6$ gas (sulfur hexafluoride gas) may be employed to cut the wafer 110 by plasma etching. The chip body 10 cut by the RIE process has an inclined outer periphery (see FIG. 4). A BOSCH process may be used to cut the wafer 110. The BOSCH process enables deep digging by alternatively feeding $SF_6$ gas and $C_4F_8$ gas to the chamber, accommodating the wafer 110, of a plasma etching device to alternatively repeat the process of etching the wafer 110 and then protecting the side wall of the etched portion. The outer periphery of a chip body 10 cut by the BOSCH process is scalloped (see FIG. 3).

The chemical cutting of the wafer 110 has the following advantageous effects: The chip body 10 has reduced damage, reduced chipping, reduced stress (stress relief), and reduced warpage. In other words, the chemical cutting of the wafer 110 is more effective than the mechanical cutting.

After the wafer 110 is divided, "(7) Chip body transferring process" and "(8) Process of removing adhesive layer and support plate" are performed as in the second embodiment (see FIGS. 13H to 13I and 18A to 20C).

Fourth Embodiment

A method of manufacturing the semiconductor device 1 will now be described.

"(1) Wafer preparing process" is performed as in the second embodiment" (see FIGS. 12A and 15A to 17K).

(1b) Forming Grooves with a Grid Pattern

Figure 22A:
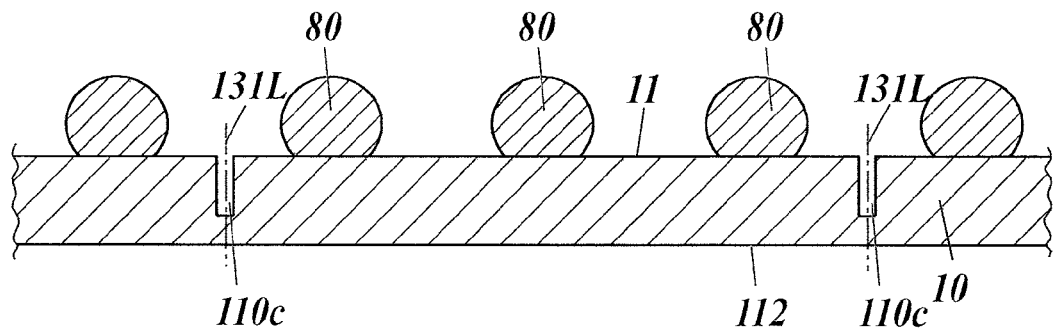
FIGS. 22A to 22C are manufacturing process diagrams of a semiconductor device.

With reference to FIG. 22A, grooves 110c are formed on the first main face 111 of the wafer 110 into a grid pattern along the designed dividing line 131L. More specifically, each groove 110c is formed by placing a blade on the first main face 111 of the wafer 110 and then moving the blade or the wafer 110 until the blade barely reaches the second main face 112 (mechanical cutting called "half dicing"). The groove 110c is deeper than a target thickness of the chip body 10. Alternatively, the groove 110c may be formed chemically or thermally with laser (for example, etching through a mask formed on the first main face 111 of the wafer 110 (dry etching or wet etching)).

(2b) Support Plate Bonding Process

Figure 22B:
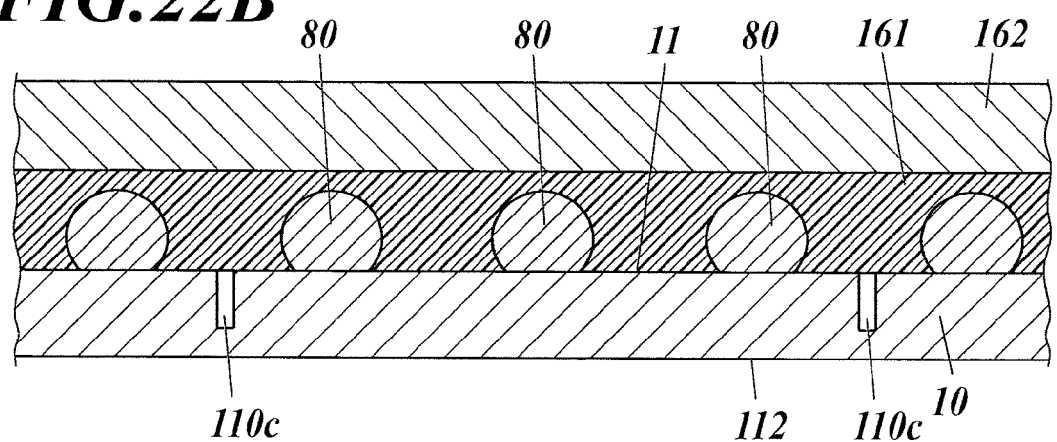

The support plate 162 is bonded to the first main face 111 of the wafer 110 via the adhesive layer 161 as in "(2) Support plate bonding process" in the second embodiment (see FIG. 22B).

(3b) Wafer Thinning and Dividing Process

Figure 22C:
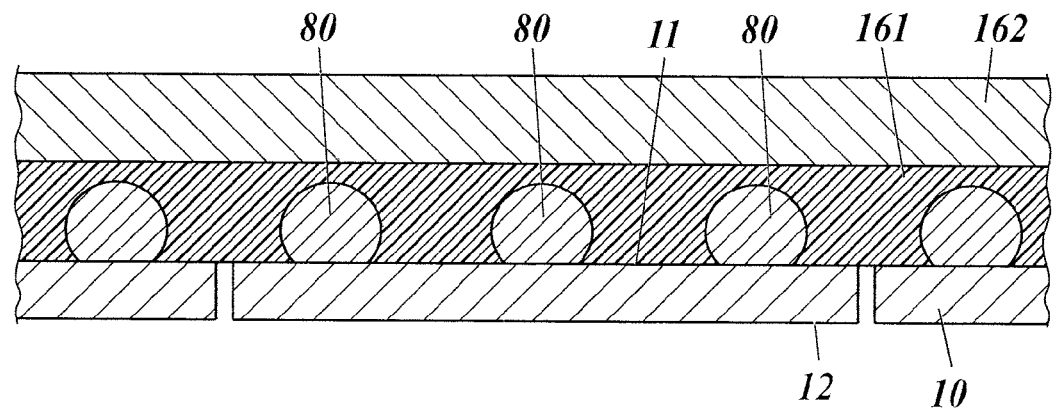

The second main face 112 of the wafer 110 is polished or ground with a grinder as in "(3) Wafer thinning process" in the second embodiment. This process thins the wafer 110, as shown in FIG. 22C, and causes the grooves 110c to reach the second main face 112 to divide the wafer 110 into multiple chip bodes 10.

After dividing the wafer 110, "(5) Reinforcing layer preparing process", "(6) Reinforcing layer bonding process", "(7) Chip body transferring process", and "(8) Process of removing adhesive layer and support plate" are performed as in the second embodiment (see FIGS. 13E to 13F and 18A to 20C).

Fifth Embodiment

A method of manufacturing the semiconductor device 1 will now be described.

"(1) Wafer preparing process", "(2) Support plate bonding process", and "(3) Wafer thinning process" are performed as in the second embodiment (see FIGS. 12A to 12C and 14A to 17K).

(1c) Reinforcing Plate Preparing Process

Figure 23A:
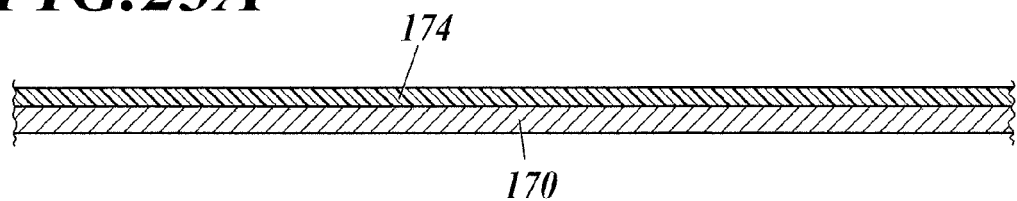
FIGS. 23A to 23C are manufacturing process diagrams of a semiconductor device.

With reference to FIG. 23A, the reinforcing plate 170 is prepared and the bonding layer 174 is formed on the reinforcing plate 170 by any coating or bonding process. Alternatively, a reinforcing plate 170 with a pre-formed bonding layer 174 may be prepared. If the reinforcing plate 170 is prepreg, a reinforcing plate 170 without a bonding layer 174 is prepared.

(2c) Reinforcing Plate Bonding Process

Figure 23B:
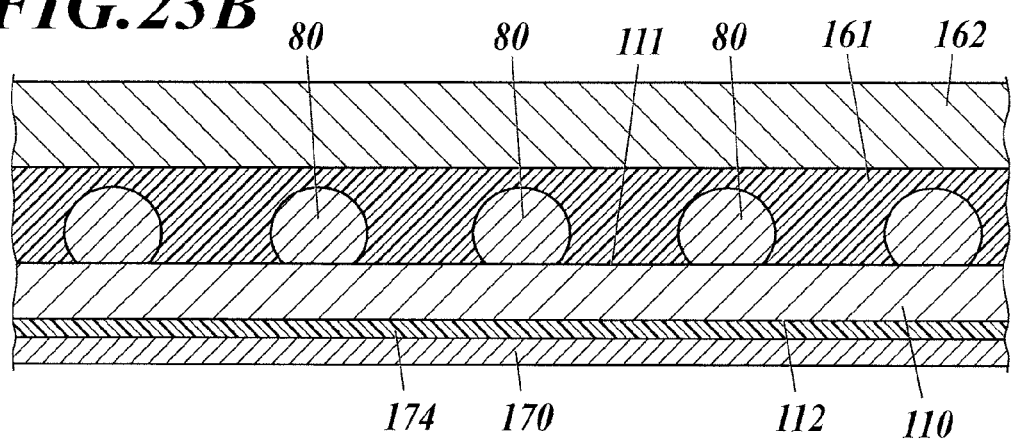

With reference to FIG. 23B, the reinforcing plate 170 is bonded to the second main face 112 of the wafer 110 via the bonding layer 174 and the bonding layer 174 is cured. If the reinforcing plate 170 is prepreg, the prepreg is directly bonded to the second main face 112 of the wafer 110 and the prepreg is cured. Such a direct bonding of the prepreg is advantageous from the following two perspectives: The absence of the bonding layer eliminates the warpage caused by the bonding layer; and the absence of the bonding layer, which does not substantially contribute to the enhancement of the rigidity, can contribute to thinning.

(3c) Reinforcing Plate Dividing Process

Figure 23C:
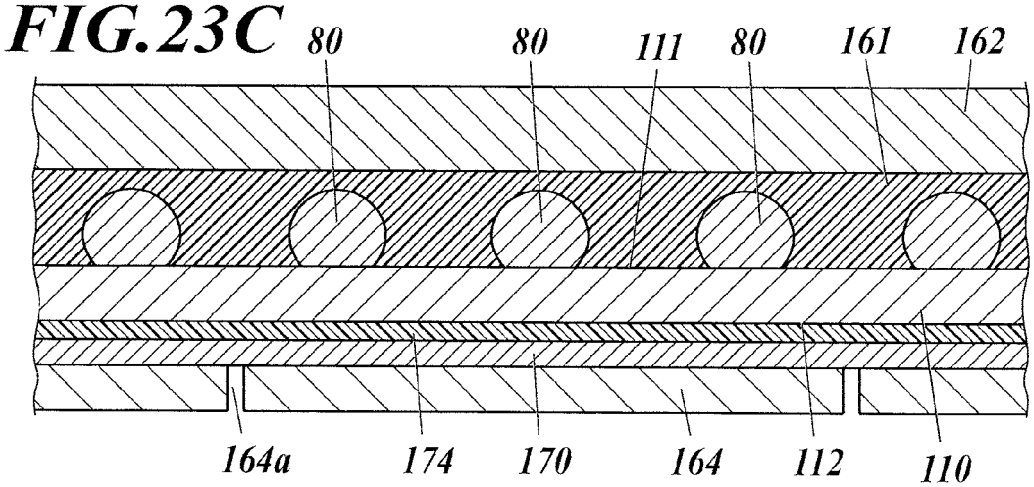

With reference to FIG. 23C, a mask 164 is formed on the reinforcing plate 170 between grooves 164a formed in a grid pattern along the designed dividing line 131L. For example, the mask (resist) 164 and the groove 164a are formed through exposure and development process of the resist.

Figure 24D:
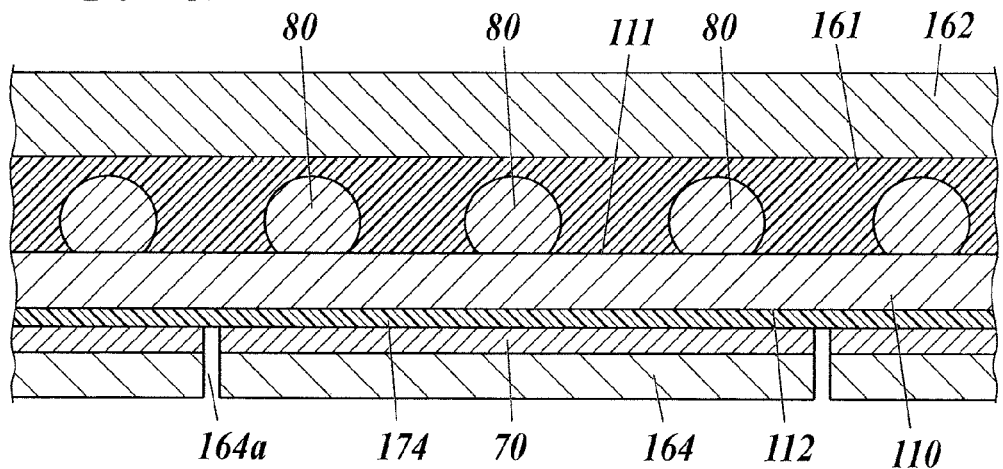
FIGS. 24D to 24E are manufacturing process diagrams of a semiconductor device.

With reference to FIG. 24D, the parts of the reinforcing plate 170 at the grooves 164a are removed by etching to divide the reinforcing plate 170 into multiple reinforcing layers 70.

The mask 164 is removed.

The reinforcing plate 170 may be cut by mechanical (with a blade) or thermal means. Furthermore, the bonding layer 174 may be cut together with the reinforcing plate 170, which eliminates the necessity of the mask 164.

(4c) Wafer Dividing Process

Figure 24E:
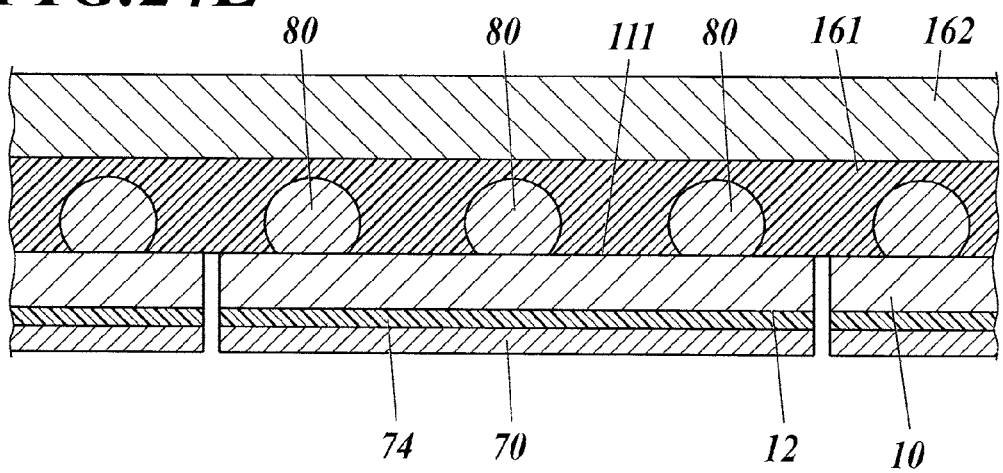

With reference to FIG. 24E, the wafer 110 is cut into multiple chip bodies 10 by dividing the wafer 110 along the designed dividing line 131L. More specifically, the designed dividing line 131L of the wafer 110 is plasma-etched through a mask of the reinforcing plate 170. In this case, the bonding layer 174 is also divided along the designed dividing lines 131L and the adhesive layer 161 is also slightly plasma-etched.

The wafer 110 may be mechanically divided with a blade, which involves mechanical division of the bonding layer 174 and notching of the surface of the bonding layer 174. Alternatively, the wafer 110 may be cut by any thermal means.

After dividing the wafer 110, "(7) Chip body transferring process", and "(8) Process of removing adhesive layer and support plate" are performed as in the second embodiment (see FIGS. 13H to 13I and 18A to 20C).

Sixth Embodiment

A method of manufacturing the semiconductor device 1 will now be described.

"(1) Wafer preparing process", "(2) Support plate bonding process", and "(3) Wafer thinning process" are performed as in the second embodiment" (see FIGS. 12A to 12C and 14A to 17K).

"(1c) Reinforcing plate preparing process" and "(2c) Reinforcing plate bonding process" are performed as in the fifth embodiment (see FIGS. 23A and 23B).

(1d) Wafer Transferring Process

Figure 25A:
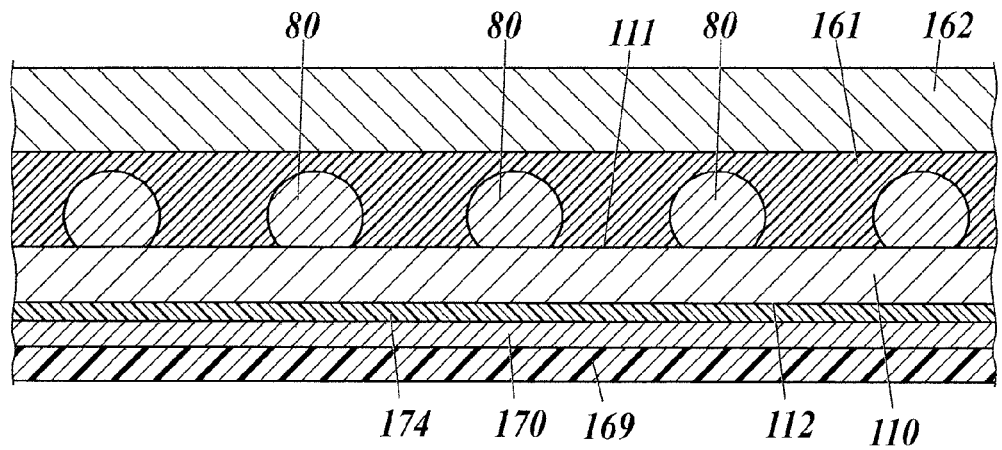
FIGS. 25A to 25C are manufacturing process diagrams of a semiconductor device.

With reference to FIG. 25A, the reinforcing plate 170 is bonded to an adhesive tape 169 (for example, dicing tape). The adhesive tape 169 is surrounded and held a frame (dicing frame).

(2d) Process of Removing Adhesive Layer and Support Plate

Figure 25B:
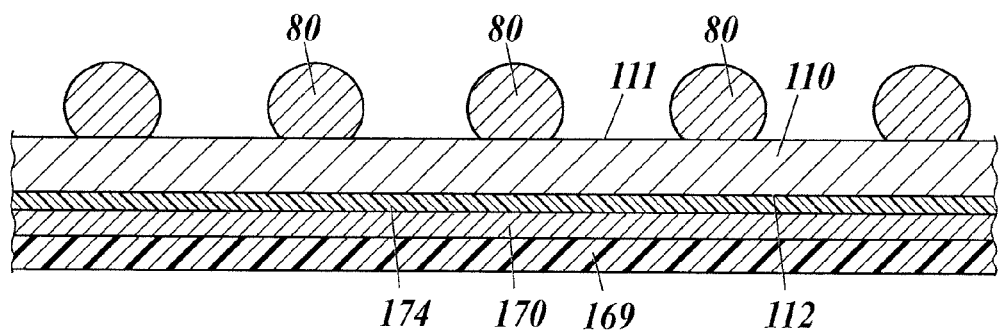

With reference to FIG. 25B, the support plate 162 and the adhesive layer 161 are removed from the wafer 110. The support plate 162 and the adhesive layer 161 is removed as in "(8) Process of removing adhesive layer and support plate" in the second embodiment.

Alternatively, "(1d) Wafer transferring process" may be performed after "(2d) Process of removing adhesive layer and support plate".

(3d) Wafer and Reinforcing Plate Dividing Process

Figure 25C:
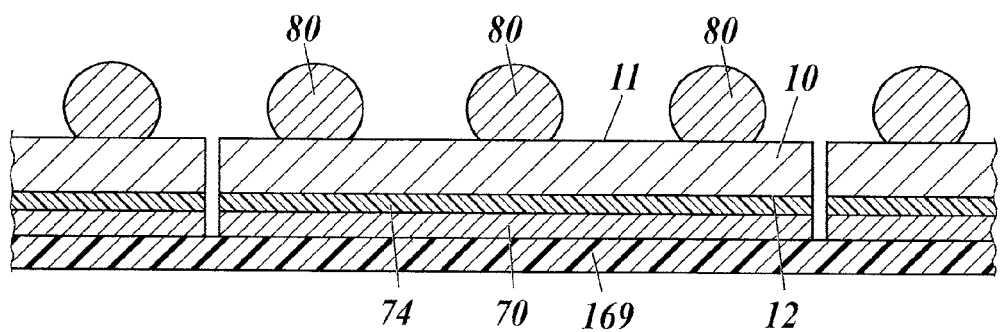

With reference to FIG. 25C, the wafer 110 is cut into multiple chip bodies 10 and the adhesive layer 174 and the reinforcing plate 170 are divided together with the chip body 10 into adhesive layers 74 and reinforcing layers 70. More specifically, the wafer 110, the adhesive layer 174, and the reinforcing plate 170 are mechanically cut with a blade. In this case, a blade is replaced for each portion to be cut: the wafer 110, the adhesive layer 161, and the reinforcing plate 170 to cut them separately in this order. Alternatively the wafer 110, the adhesive layer 174 and the reinforcing plate 170 may be cut in one shot. Alternatively, laser (thermal) cutting may be used alone or in combination with mechanical cutting.

Seventh Embodiment

A method of manufacturing the semiconductor device 1 will now be described.

(1e) Wafer Preparing Process

Figure 26A:
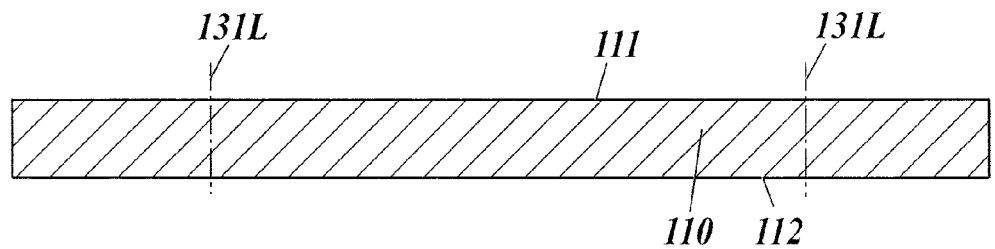
FIGS. 26A to 26D are manufacturing process diagrams of a semiconductor device.

With reference to FIG. 26A, the wafer 110 is prepared as in "(1) Wafer preparing process" in the second embodiment, except for the process of forming the solder bumps 80, described with reference to FIGS. 14G, 15F, 16E and 17H to 17I. The resulting wafer 110 has no solder bump 80.

(2e) Support Plate Bonding Process

Figure 26B:
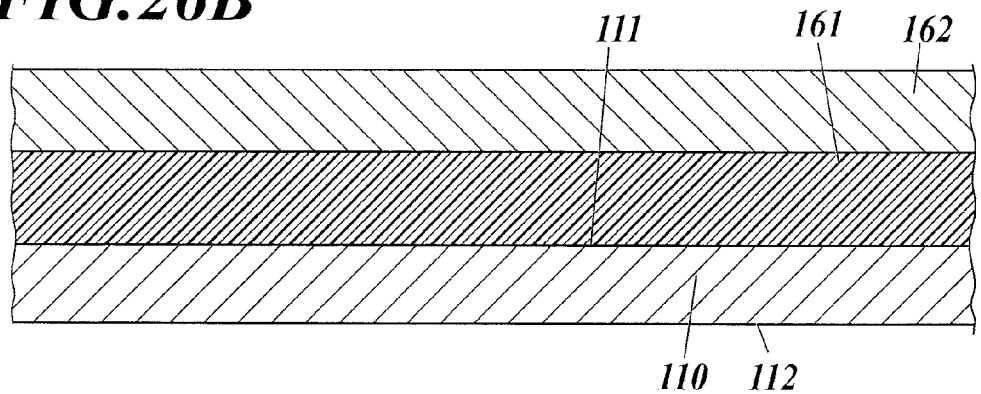

"(2) Support plate bonding process" is performed as in the second embodiment" (see FIG. 26B)

(3e) Wafer Thinning Process

Figure 26C:
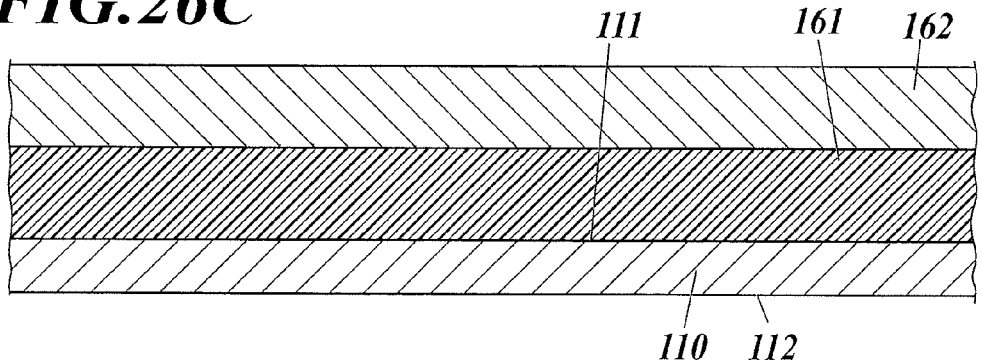

"(3) Wafer thinning process" is performed as in the second embodiment" (see FIG. 26C).

(4e) Reinforcing Plate Preparing and Bonding Process

Figure 26D:
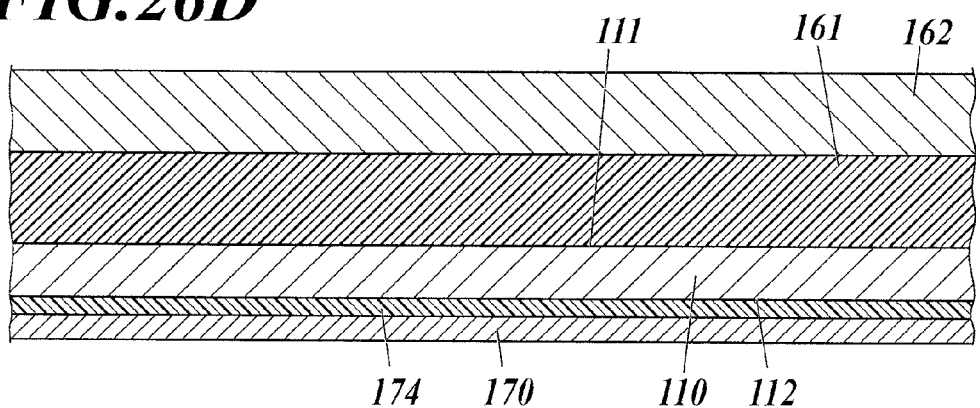

"(1c) Reinforcing plate preparing process" and "(2c) Reinforcing plate bonding process" are performed as in the fifth embodiment (see FIG. 26D).

(5e) Process of Removing Adhesive Layer and Support Plate

Figure 27E:
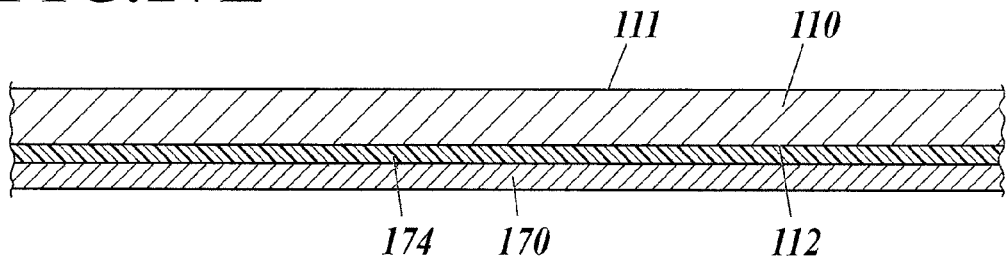
FIGS. 27E to 27H are manufacturing process diagrams of a semiconductor device.

"(2d) Process of removing adhesive layer and support plate" is performed as in the sixth embodiment (see FIG. 27E).

(6e) Solder Bump Forming Process

Figure 27F:
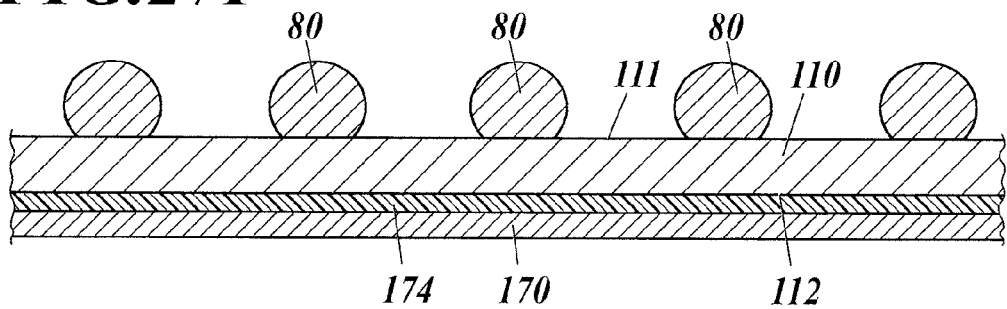

The solder bumps 80 are formed (see FIG. 27F).

(7e) Wafer Transferring Process

Figure 27G:
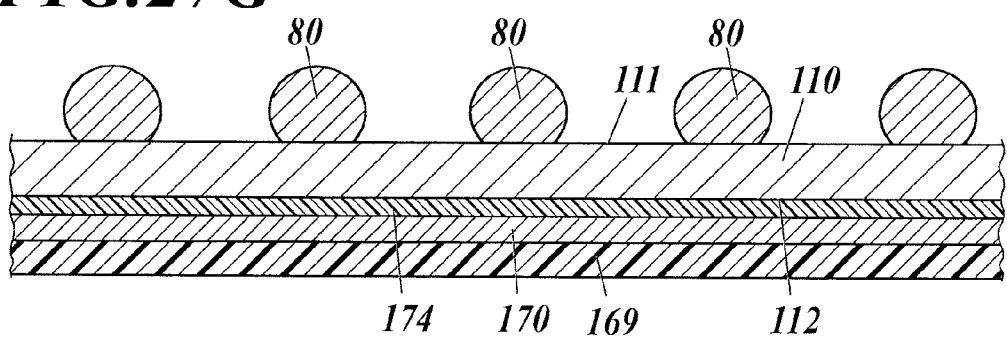

"(1d) Wafer transferring process" is performed as in the sixth embodiment (see FIG. 27G).

(8e) Wafer and Reinforcing Plate Dividing Process

Figure 27H:
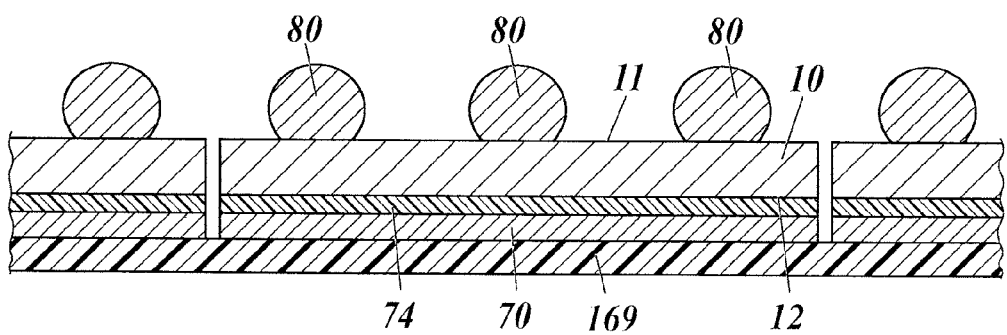

"(3d) Wafer and reinforcing plate dividing process" is performed as in the sixth embodiment (see FIG. 27H).

Eighth Embodiment

A method of manufacturing the semiconductor device 1 will now be described.

"(1e) Wafer preparing process", "(2e) Support plate bonding process", and "(3e) Wafer thinning process" are performed as in the seventh embodiment (see FIGS. 26A to 26C).

(1f) Wafer Dividing Process

Figure 28A:
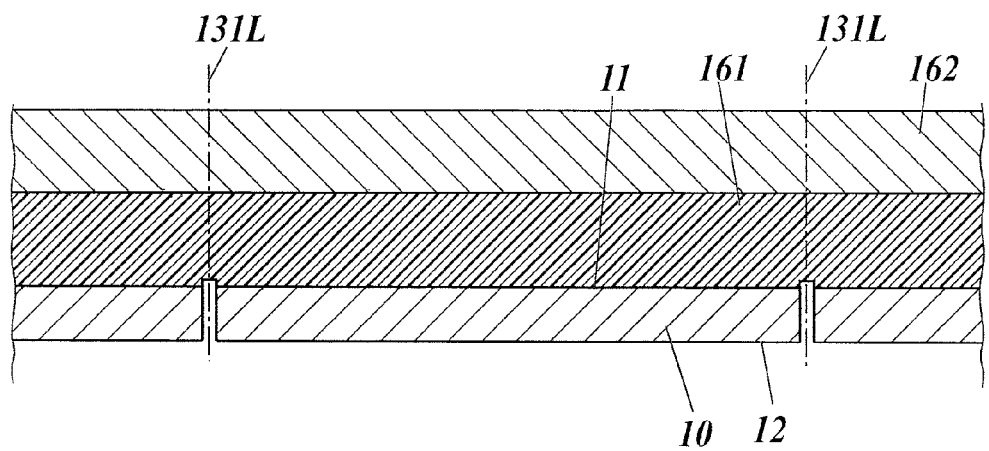
FIGS. 28A to 28C are manufacturing process diagrams of a semiconductor device.

With reference to FIG. 28A, the wafer 110 is mechanically cut with a blade along the designed dividing lines 131L into multiple chip bodies 10. The wafer 110 may be cut by any thermal means.

(2f) Reinforcing Plate Preparing and Bonding Process

Figure 28B:
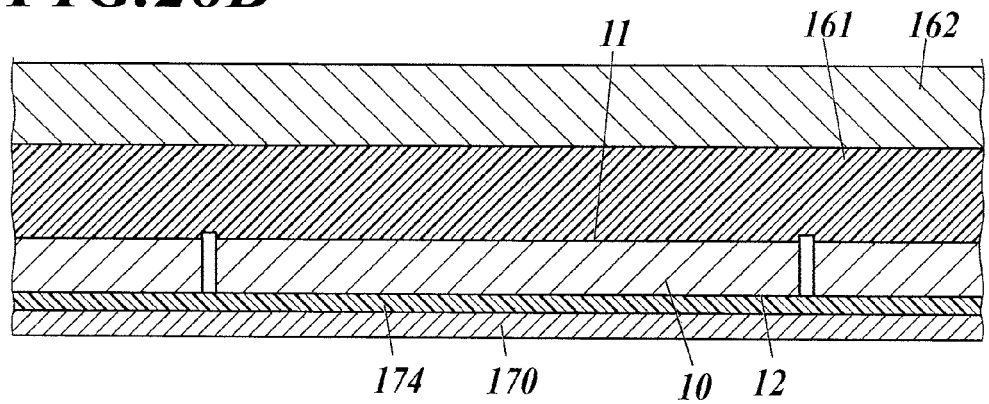

The reinforcing plate 170 is bonded to the second main faces 12 of the multiple chip bodies 10 via the bonding layer 174 (see FIG. 28B) as "(4e) Reinforcing plate preparing and bonding process" in the seventh embodiment.

(3f) Process of Removing Adhesive Layer and Support Plate

Figure 28C:
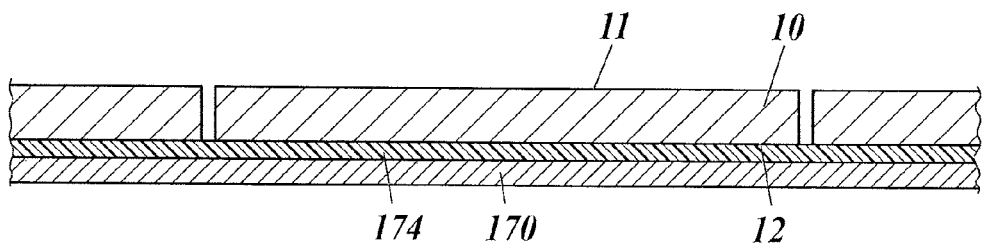

The adhesive layer 161 and the support plate 162 are removed as in "(5e) Process of removing adhesive layer and support plate" in the seventh embodiment (see FIG. 28C).

(4f) Solder Bump Forming Process

Figure 29D:
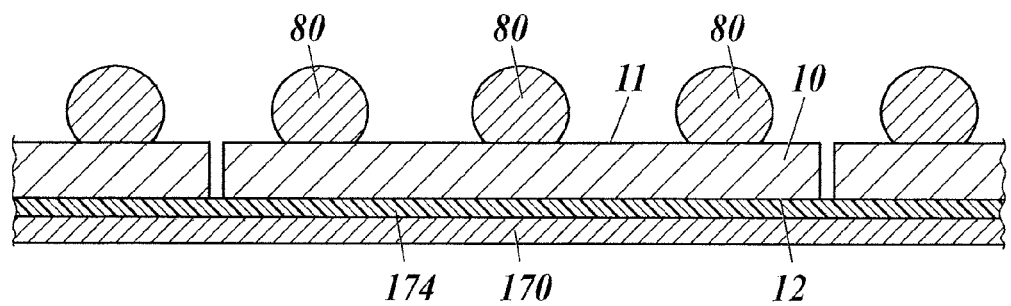
FIGS. 29D to 29F are manufacturing process diagrams of a semiconductor device.

The solder bumps 80 are formed (see FIG. 29D).

(5f) Chip Body Transferring Process

Figure 29E:
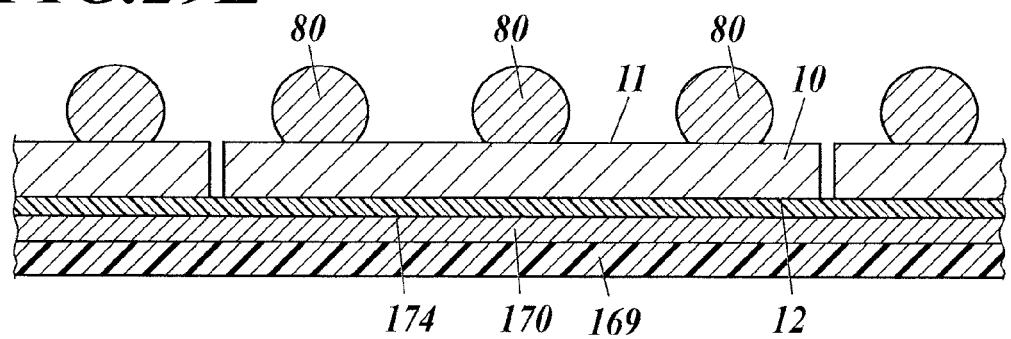

The reinforcing plate 170 is bonded to an adhesive tape 169 (for example, dicing tape) to transfer the chip bodies 10 to the adhesive tape 169 (see FIG. 29E).

(6f) Reinforcing Plate Dividing Process

Figure 29F:
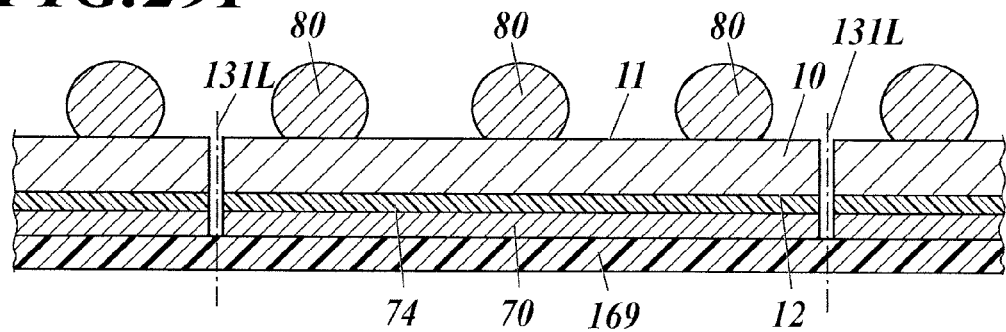

The reinforcing plate 170 and the bonding layer 174 are mechanically cut with a blade along the designed dividing lines 131L into chip bodies 10 (see FIG. 29F). The reinforcing plate 170 and the bonding layer 174 may be cut by any thermal means.

Ninth Embodiment

"(1e) Wafer preparing process" is performed (see FIG. 26A) as in the seventh embodiment.

Figure 30A:
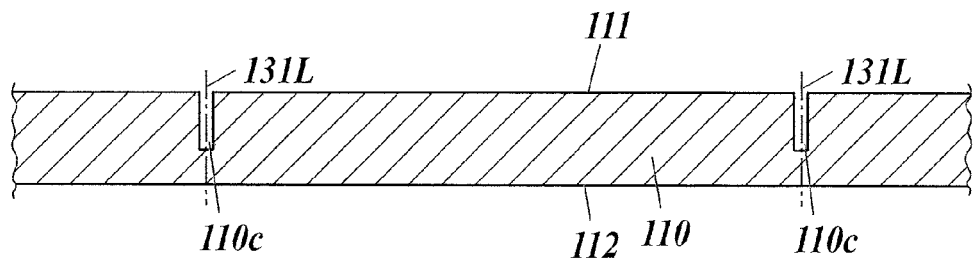
FIGS. 30A to 30C are manufacturing process diagrams of a semiconductor device.
Figure 30B:
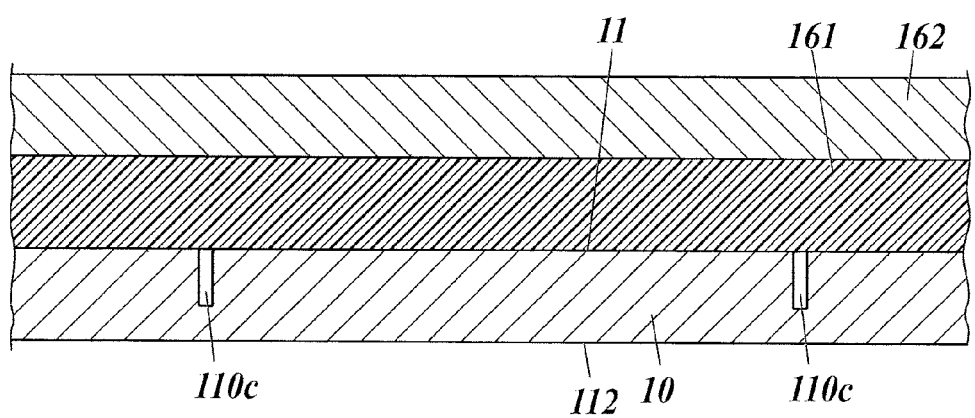
Figure 30C:
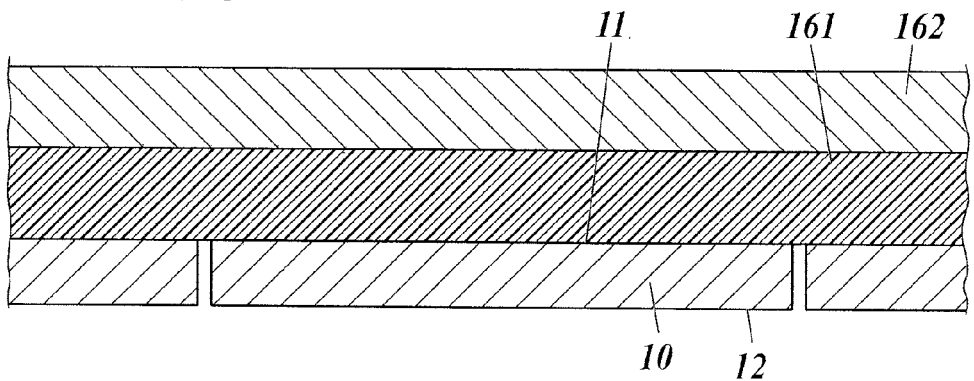

"(1b) Forming grooves in a grid pattern", "(2b) Support plate bonding process", and "(3b) Wafer thinning and dividing process" are performed as in the fourth embodiment (See FIGS. 30A to 30C).

"(2f) Reinforcing plate preparing and bonding process", "(3f) Process of removing adhesive layer and support plate", "(4f) Solder bump forming process", "(5f) Chip body transferring process", and "(6f) Reinforcing plate dividing process" are performed (See FIGS. 28B, 28C and 29D to 29F).

Tenth Embodiment

Figure 31:
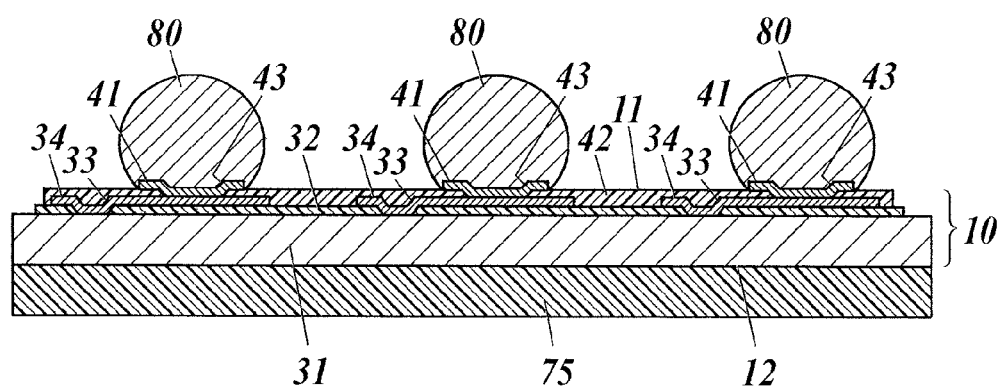
FIG. 31 is a cross-sectional view of a semiconductor device.

FIG. 31 is a cross-sectional view of a semiconductor device 1A.

The semiconductor device 1A according to the tenth embodiment has the same or similar components as those of the semiconductor device 1 according to the first embodiment. The same reference numerals are assigned to such components without redundant description and only differences will now be described.

Figure 32:
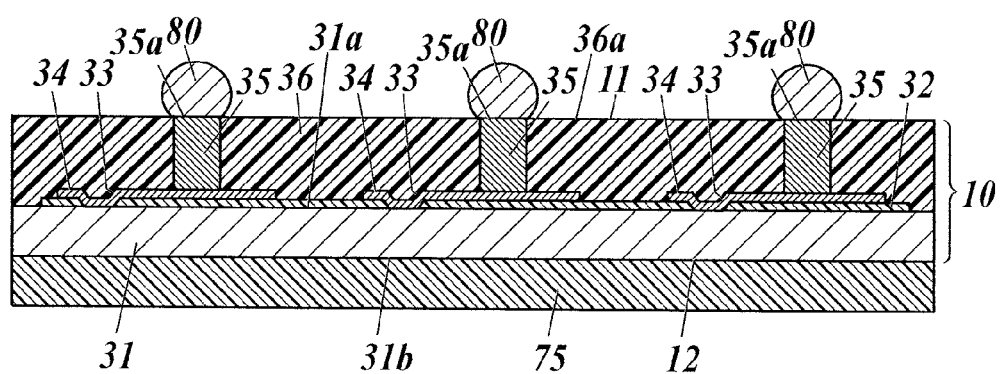
FIG. 32 is a cross-sectional view of a semiconductor device.

A chip body 10 has a first main face 11 coated with a resin, in particular, a thermosetting resin that shrinks when it is cured. More specifically, the chip body 10 is a CSP with rewiring layers and UBM layers. The insulating film 32 and the protective layer 42 are each composed of a resin. The protective layer 42 is deposited on the insulating film 32 formed on the device substrate 31. When cured, the insulating film 32 and the protective layer 42 shrink and have internal stress (residual stress) to generate a downward bending moment in the device substrate 31. Alternatively, as shown in FIG. 32, the chip body 10 may be a CSP with rewiring layers and pillar terminals. The protective layer 36 may be stacked on the insulating film 32 formed on the device substrate 31.

In the first embodiment, the reinforcing layer 70 is bonded to the second main face 12 of the chip body 10, while in the tenth embodiment, a cured shrinkage layer 75 composed of a resin, in particular, a thermosetting resin is formed on the second main face 12 of the chip body 10.

The cured shrinkage layer 75 is composed of a resin that shrinks due to heat when it is cured. The cured shrinkage layer 75 has internal stress (residual stress) and generates an upward bending moment in the device substrate 31. Since the internal stress generated in the cured shrinkage layer 75 is larger than that generated in the insulating film 32 and the protective layer 42, the bending moment occurring in the cured shrinkage layer 75 can successfully offset that occurring in the insulating film 32 and the protective layer 42 to prevent the warpage of the device substrate 31. The contact of structures, such as rewiring layers, electrodes for external connections, and UBM layers, with the cured shrinkage resin causes a high stress (bending moment). Such a high stress can be also offset by the cured shrinkage layer 75, which also have a high bending moment, to reduce the warpage.

The cured shrinkage layer 75 has a higher linear expansion coefficient than the insulating film 32, the protective layer 42, and the protective layer 36. This is because the cured shrinkage layer 75 undergoes a greater shrinkage at the time of a variation in temperature from the curing temperature to the normal temperature than that of the insulating film 32, the protective layer 42, and the protective layer 36 at the time of a variation in temperatures from the curing temperature to the normal temperature.

The cured shrinkage layer 75 has a higher curing temperature than the insulating film 32, the protective layer 42, and the protective layer 36. This is because the cured shrinkage layer 75 undergoes a greater shrinkage at the time of a variation in temperature from the curing temperature to the normal temperature than that of the insulating film 32, the protective layer 42, and the protective layer 36 at the time of a variation in temperatures from the curing temperature to the normal temperature.

If the cured shrinkage layer 75 has the same curing temperature and linear expansion coefficient as those of the insulating film 32, the protective layer 42, and the protective layer 36, the cured shrinkage layer 75 has a higher elastic modulus (for example, storage modulus) than the insulating film 32, the protective layer 42, and the protective layer 36.

The cured shrinkage layer 75 is composed of, for example, a thermosetting polyimide resin, polybenzoxazole, or epoxy resin. In particular, the cured shrinkage layer 75 may be composed of any of the following epoxy resins: From Hitachi Chemical Co., Ltd. (longitudinal elastic modulus: 17 GPa, linear expansion coefficient: 30/33 ppm, thickness: 25-50 μm, curing temperature: 230° C.), from Rohm and Haas Electronic Materials LLC or Rohm and Haas Japan K.K. (longitudinal elastic modulus: 4.3 GPa, linear expansion coefficient: 59 ppm, thickness: 25-50 μm, curing temperature: 200° C.), from HDM (longitudinal elastic modulus: 1.8-2.3 GPa, linear expansion coefficient: 60-80 ppm, thickness: 25-50 μm, curing temperature: 175-320° C.), from SANYU REC CO., LTD (longitudinal elastic modulus: 26 GPa, linear expansion coefficient: 9 ppm, thickness: 25-50 μm), or from NAMIX (longitudinal elastic modulus: 32 GPa, linear expansion coefficient: 6.8/31 ppm, thickness: 25-50 μm).

As described above, the contact of structures, such as rewiring layers, with the cured shrinkage resin causes a high stress (bending moment). Taking advantage of this nature, a structure, such as a metal layer, may be formed between the second main face 12 and the cured shrinkage layer 75 such that the structure is in contact with the cured shrinkage layer 75. Such a contact can increase an offset force to further reduce warpage. Such a structure may be electrically insulated with integrated circuits formed on the device substrate 31.

Eleventh Embodiment (1) Wafer preparing process", "(2) Support plate bonding process", and "(3) Wafer thinning process" are performed as in the second embodiment" (see FIGS. 12A to 12C and 14A to 16E).

(1h) Process of Forming Cured Shrinkage Layer

Figure 33A:
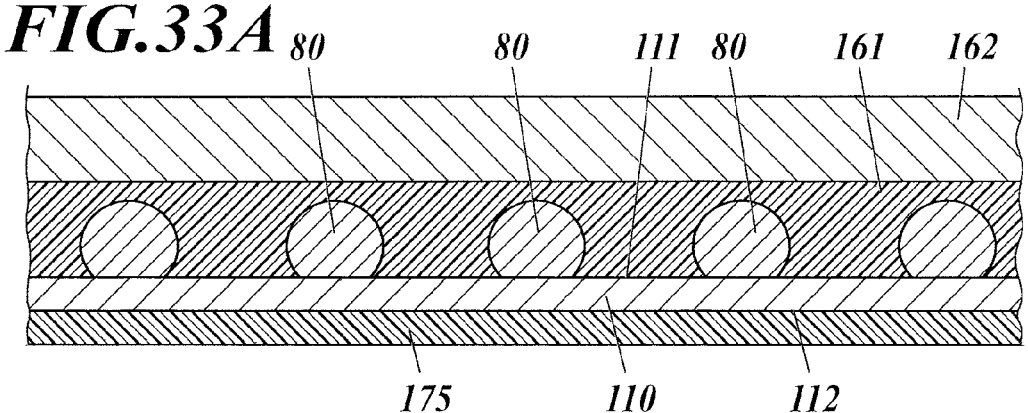
FIGS. 33A to 33C are manufacturing process diagrams of a semiconductor device.

With reference to FIG. 33A, a thermosetting resin is applied to the second main face 112 of the wafer 110. The applied thermosetting resin is heated until it reaches the curing temperature to cure the thermosetting resin into the cured shrinkage layer 175. The thickness of the cured shrinkage layer 175 should be less than the thickness reduced amount of the wafer 110 reduced in "(3) Wafer thinning process".

If solder bumps are formed prior to the shrinkage of the cured shrinkage layer 75, the heating temperature (curing temperature of the cured shrinkage layer 75) should be lower than the melting (reflow) temperature of the solder bumps 80. The heat-resistant temperature of the cured shrinkage layer 75 should be higher than the reflow temperature of the solder bumps 80. If the device substrate 31 includes an electronic device, such as memory cells, which undergo any thermal degradation, the heating temperature (curing temperature of the bonding layer 74) should be lower, for example, 200° C. or less.

(2h) Wafer Transferring Process

Figure 33B:
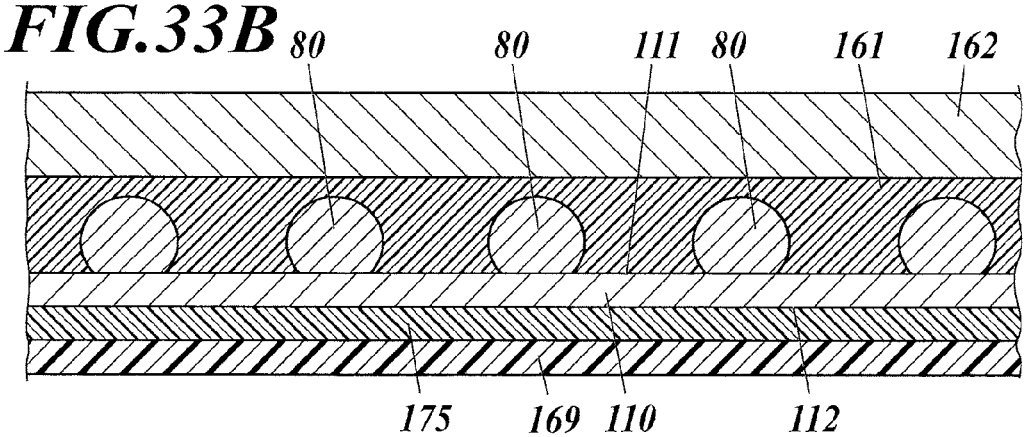

With reference to FIG. 33B, the cured shrinkage layer 175 is bonded to the adhesive tape (for example, dicing tape) 169 to transfer the wafer 110 to the adhesive tape 169.

(3h) Process of Removing Adhesive Layer and Support Plate

Figure 33C:
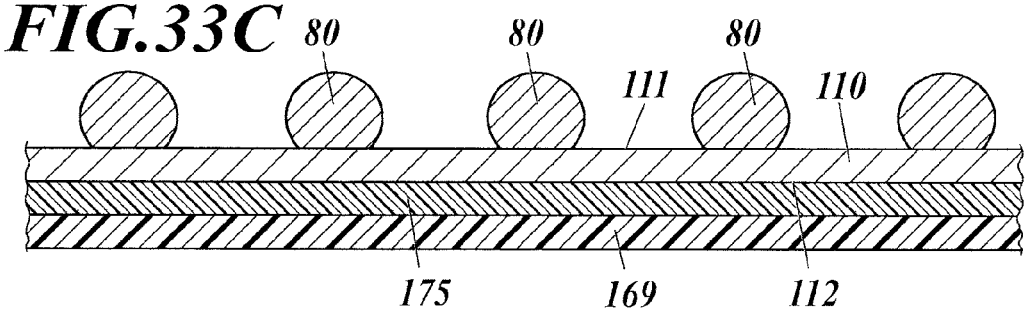

With reference to FIG. 33C, the support plate 162 and the adhesive layer 161 are removed from the wafer 110. The cured shrinkage layer 175 formed on the second main face 112 of the wafer 110 can prevent an increase in warpage of the wafer 110 even if the support plate 162 and the adhesive layer 161 are removed.

(4h) Process of Dividing Wafer and Cured Shrinkage Layer

Figure 34D:
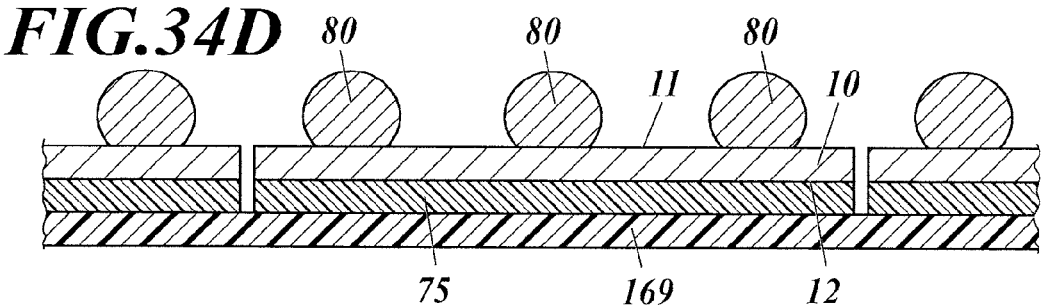
FIG. 34D is a manufacturing process diagram of a semiconductor device.

With reference to FIG. 34D, the wafer 110 and the cured shrinkage layer 175 are together divided into multiple chip bodies 10 and multiple cured shrinkage layers 75, respectively. The wafer 110 and the cured shrinkage layer 175 may be cut by mechanical (for example, with a blade), chemical (for example, plasma etching or wet etching), or thermal means.

Twelfth Embodiment

"(1) Wafer preparing process", "(2) Support plate bonding process", and "(3) Wafer thinning process" are performed as in the second embodiment (see FIGS. 12A to 12C and 14A to 16E).

(1i) Process of Forming Cured Shrinkage Layer

Figure 35A:
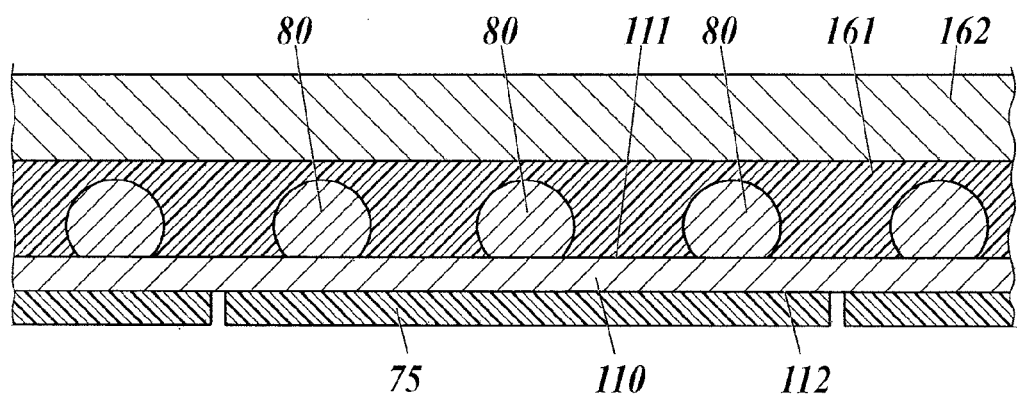
FIGS. 35A to 35C are manufacturing process diagrams of a semiconductor device.

With reference to FIG. 35A, a thermosetting resin is applied to the second main face 112 of the wafer 110 by an inkjet process to pattern the thermosetting resin into a grid. The applied thermosetting resin is heated until it reaches the curing temperature to cure the thermosetting resin into the cured shrinkage layers 75 in a grid pattern.

(2i) Wafer Dividing Process

Figure 35B:
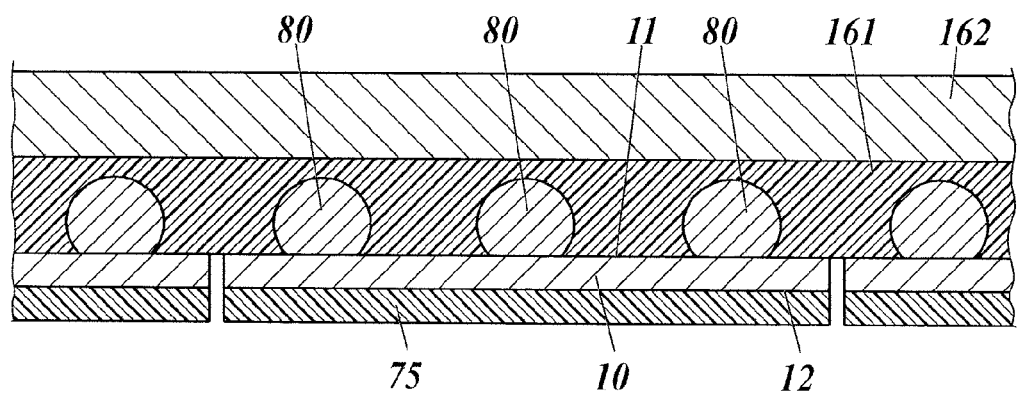

With reference to FIG. 35B, the wafer 110 is cut into multiple chip bodies 10. The wafer 110 may be cut by mechanical (for example, with a blade), chemical (for example, plasma etching or wet etching), or thermal means. In particular, the wafer 110 is preferably divided into wafers 110 by plasma etching through a mask of the cured shrinkage layer 75.

(3i) Chip Body Transferring Process

Figure 35C:
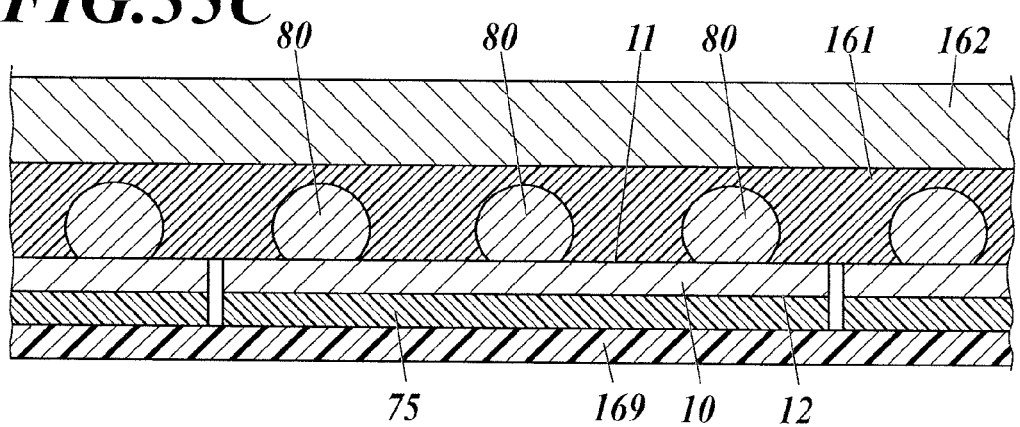

With reference to FIG. 35C, the cured shrinkage layer 75 is bonded to the adhesive tape 169 (for example, dicing tape) to transfer the chip bodies 10 to the adhesive tape 169.

(4i) Process of Removing Adhesive Layer and Support Plate

The support plate 162 and the adhesive layer 161 are removed from the chip bodies 10. The cured shrinkage layer 75 formed on the second main face 12 of the chip body 10 can prevent increased warpage of the chip body 10 even if the support plate 162 and the adhesive layer 161 are removed.

A combination of the above embodiments with any of the following methods can reduce warpage more effectively: Front side: Besides selecting a resin that is less likely to shrink during the curing reaction, warpage can be reduced by decreasing a curing temperature as much as possible to reduce a gap between the curing temperature and the normal temperature, selecting a material with a low linear expansion coefficient, or increasing the filler content to reduce the linear expansion coefficient.

Rear surface: The rear surface is dry-polished (mirror-finished).

To thin a semiconductor device while preventing warpage, the adhesive layer preferably prevents the warpage of the reinforcing layer. To achieve that, the adhesive layer should be composed of a resin that is less likely to shrink during the curing reaction or a material with a lower linear expansion coefficient or have a lower curing temperature as much as possible to reduce a gap between the curing temperature and the normal temperature.

More specifically, the adhesive layer should have a lower linear expansion coefficient than the insulating film 32, the protective layer 42, and the protective layer 36. The adhesive layer should have a lower curing temperature than the insulating film 32, the protective layer 42, and the protective layer 36. If the curing temperature and linear expansion coefficient of the adhesive layer are equal to those of the insulating film 32, the protective layer 42, and the protective layer 36, the adhesive layer should have a lower elastic modulus (for example, storage modulus) than that of the insulating film 32, the protective layer 42, and the protective layer 36.

The adhesive is preferably a non-thermosetting resin, such as (i) a low-temperature curable resin (for example, 200° C. or less) or (ii) a photocurable resin.

A combination of the above methods can prevent the warpage as much as possible to thin the reinforcing layer.

Technically useful restrictions for implementing the present invention will now be described.

(C1) Solder bumps (electrodes for external connections) are formed prior to the bondage of a support plate to the first main face.

(C2) After a semiconductor wafer is prepared and half diced, the support plate is bonded to the first main face, the second main face is ground, and the semiconductor wafer are divided into multiple chip bodies. A reinforcing plate is bonded or a cured shrinkage layer is formed and subsequently cut at the portions corresponding to the dicing lines and then the support plate is removed.

(C3) The support plate is bonded to the first main face of semiconductor wafer, the second main face is ground, and then the semiconductor wafer is divided. A reinforcing plate is bonded or a cured shrinkage layer is formed. After the reinforcing plate or the cured shrinkage layer is cut, the support plate is removed.

(C4) A variance in height between the top surfaces of electrodes for external connections, such as solder bumps, is 50 μm or less, preferably 20 μm or less, thus maintaining uniformity or coplanarity.

(C5) The device substrate has a thickness less than 50 μm or the semiconductor substrate has an area of 40 mm² or more.

(C6) The device substrate is provided with memory cells thereon. The cured shrinkage layer or the bonding layer is curable at low temperatures (200° C. or less).

(C7) The rewiring layer of the device substrate has a large area for routing common signal wires for power supply and grounding.

(C8) The lateral sides of the reinforcing layer (or the cured shrinkage layer) are continuous or flush with the device substrate or have the same size as that of the device substrate. The lateral sides of the device substrate are (1) scalloped (Bosch) or (2) tapered.

(C9) The reinforcing layer or the cured shrinkage layer is slightly larger than the device substrate by 10 μm or more to 50 μm or less.

(C10) The device substrate is provided with a low-k multilayer wiring structure thereon. The bonding layer covers the entire outer periphery of the device substrate.

(C11) The semiconductor device is provided with electrodes for external connections, such as solder bumps, thereon. The electrodes for external connections are either (1) hemispherical bumps without an overhang or (2) bumps having an overhang with their lower portions covered with a resin film (overcoat layer).

(C12) The semiconductor substrate has a mirror-finished rear surface.

(C13) The reinforcing layer is composed of a resin and a carbon (or glass) fiber and is directly bonded to the rear surface without an adhesive layer.

Other restrictions are described in the above embodiments.

The fabricating methods described in the above embodiments are typical and any elements of the methods may be combined as needed to implement the present invention.

According to the embodiments of the present invention described above, a wafer is thinned after a support plate is bonded thereto and the reinforcing layer 70 or the cured shrinkage layer 75 is bonded before the support plate is removed. This method can prevent large warpage during the processing and after the division of the wafer into chips even if a chip body undergoes a high stress (bending moment) that causes large warpage because the thinned wafer is always supported either by the support plate or by the reinforcing layer 70 or the cured shrinkage layer 75 after the thinning of the wafer. This allows a wafer to be transferred without damage, prevents processing troubles, maintains uniformity or coplanarity after the division of the wafer into separate chips, and improves the yield rate and reliability even if each chip body has a fragile structure.

The prevention of warpage enables further thinning of semiconductor devices and thinning of larger chips.

The formation of solder bumps is completed before the thinning of a wafer. This can reduce the impact of warpage and enhance reliability.

The entire disclosure of Japanese Patent Application No. 2015-022191 filed on Feb. 6, 2015 including description, claims, drawings, and abstract are incorporated herein by reference in its entirety.

What is claimed is:

1. A method of manufacturing a semiconductor device, comprising steps of:
    (a) bonding a support plate to a first main face of a wafer, the first main face having an integrated circuit disposed thereon;
    (b) thinning the wafer by polishing or grinding a second main face after step (a), the second main face being opposite to the first main face;
    (c) dividing the wafer into multiple chip bodies concurrently with or after step (b);
    (d) bonding multiple reinforcing layers to second main faces of the respective chip bodies after step (c); and
    (e) removing the support plate after step (d).

2. A method of manufacturing a semiconductor device, comprising steps of:
    (a) bonding a support plate to a first main face of a wafer, the first main face having an integrated circuit disposed thereon;

(b) thinning the wafer by polishing or grinding a second main face after step (a), the second main face being opposite to the first main face;
(c) bonding multiple reinforcing layers to the second main face of the wafer so as to be arrayed along the second main face of the wafer after step (b);
(d) dividing the wafer into multiple chip bodies after step (c) so that the chip bodies correspond to the respective reinforcing layers; and
(e) removing the support plate after step (d).

3. The method of manufacturing a semiconductor device according to claim 2, wherein, in step (d), the wafer is etched through the multiple reinforcing layers functioning as a mask.

4. A method of manufacturing a semiconductor device, comprising steps of:
(a) bonding a support plate to a first main face of a wafer, the first main face having an integrated circuit disposed thereon;
(b) thinning the wafer by polishing or grinding a second main face after step (a), the second main face being opposite to the first main face;
(c) bonding a reinforcing plate to the second main face after step (b);
(d) dividing the reinforcing plate to multiple reinforcing layers and dividing the wafer into multiple chip bodies so that the chip bodies correspond to the respective reinforcing layers after step (c); and
(e) removing the support plate after step (d).

5. The method of manufacturing a semiconductor device according to claim 4, wherein, in step (d), after the dividing of the reinforcing plate, the wafer is divided into the multiple chip bodies by etching the wafer through the multiple reinforcing layers functioning as a mask.

6. The method of manufacturing a semiconductor device according to claim 1, wherein a thermosetting resin film is formed on the first main face of the wafer to cover a rewiring layer formed on the wafer so that the rewiring layer is in a direct contact with the thermosetting resin film.

7. The method of manufacturing a semiconductor device according to claim 1, wherein a rigidity of a reinforcing layer is higher than a rigidity of the wafer having a thickness corresponding to a total thickness of the reinforcing layer and a bonding layer, the bonding layer bonding the reinforcing layer to the wafer.

8. A method of manufacturing a semiconductor device, comprising steps of:
(a) bonding a support plate to a first main face of a wafer, the first main face having an integrated circuit and a thermosetting resin layer covering the integrated circuit which are disposed on the first main face;
(b) thinning the wafer by polishing or grinding a second main face after step (a), the second main face being opposite to the first main face;
(c) applying a thermosetting resin to the second main face of the wafer and curing the thermosetting resin after step (b) to form a cured shrinkage layer having a higher internal stress than an internal stress of the thermosetting resin layer;
(d) dividing the wafer into multiple chip bodies after step (c); and
(e) removing the support plate after step (d).

9. The method of manufacturing a semiconductor device according to claim 8, wherein a rewiring layer formed on the wafer is covered by the thermosetting resin layer so that the rewiring layer is in a direct contact with the thermosetting resin layer.

10. The method of manufacturing a semiconductor device according to claim 8, wherein
in step (c), the cured shrinkage layer is patterned into a grid along the second main face of the wafer, and
the wafer is divided into multiple chip bodies so that the chip bodies correspond to respective cured shrinkage layers.

* * * * *